(12) United States Patent
Murray et al.

(10) Patent No.: US 8,386,980 B2
(45) Date of Patent: Feb. 26, 2013

(54) INTEGRATED CIRCUITS DESIGN

(75) Inventors: David Murray, County Galway (IE); Sean Boylan, County Galway (IE)

(73) Assignee: Duolog Research Limited, Dublin (IE)

(*) Notice: Subject to any disclaimer, the term of this patent is extended or adjusted under 35 U.S.C. 154(b) by 16 days.

(21) Appl. No.: 12/926,454

(22) Filed: Nov. 18, 2010

(65) Prior Publication Data

US 2011/0119646 A1    May 19, 2011

(30) Foreign Application Priority Data

Nov. 19, 2009   (IE) ..................................... 2009/0880

(51) Int. Cl.
*G06F 17/50* (2006.01)

(52) U.S. Cl. ...................................... 716/119; 716/126

(58) Field of Classification Search .................. 716/102, 716/119, 126; 326/39–47
See application file for complete search history.

(56) References Cited

U.S. PATENT DOCUMENTS

| RE37,195 E | * | 5/2001 | Kean ............................... 326/39 |
| 6,650,142 B1 | * | 11/2003 | Agrawal et al. .................. 326/41 |
| 2005/0005052 A1 | * | 1/2005 | Fernald et al. ................. 710/317 |

* cited by examiner

*Primary Examiner* — Vuthe Siek
*Assistant Examiner* — Mohammed Alam
(74) *Attorney, Agent, or Firm* — Jacobson Holman PLLC

(57) ABSTRACT

This invention concerns an automated method of generating a design for an I/O fabric of a target integrated circuit having a core and pins. A process tool executes algorithms to generate a synthesizable representation of the I/O fabric ring in hardware description language. It imports integrated circuit design data, and from it captures I/O specification data for a circuit core, library of cells, pin, I/O control, BSR and I/O cell chaining, and die. The tool validates the specification data, and generates the I/O fabric design by configuring and interconnecting a pin multiplexing and control matrix structures according to constraints for signal control, and timing. The structures includes on both the input and output paths of each pin a functional multiplexer matrix structure, a test multiplexer matrix structure, an override matrix structure, a multiplex select and control matrix structure, and an I/O Cell control logic. A required pin output circuit is configurable by modification of the I/O specification data, and/or, modification of a manner of wiring the algorithms, and/or by modification of the algorithms. The tool wires algorithms according to a wiring framework, and said wiring framework is modifiable.

24 Claims, 15 Drawing Sheets

INTEGRATED CIRCUITS DESIGN

This application has a priority of Irish no. 2009/0880 filed Nov. 19, 2009, hereby incorporated by reference.

FIELD OF THE INVENTION

The invention relates to design of integrated circuits and to end-product integrated circuits.

PRIOR ART DISCUSSION

FIG. 1 shows a typical integrated circuit 112 at a high level. The chip 112 contains an internal logic core 110, an I/O ring 114, and pins 116. FIG. 2 shows the logic interfaces between the core 110 and a single chip pin 116. The chip pin 116 is connected physically to an I/O cell 400 (FIG. 3), which fulfills a wide range of requirements for connecting to the environment external to the chip in a correct manner. This I/O cell 400 has a chip side interface 222 that can be used to control the I/O cell and may range from a simple output signal to a full suite of control capability including characteristics such as timing, slew-rate, output drive, pull-up/pull-down, and power. On the chip core 110 side the interfaces to I/O logic can include core signals that can be selected as device pins 218, control for Boundary Scan circuitry and registers (BSRs, FIG. 4) 219 and control for the I/O cell itself 220. There may also be two modes for these interfaces 218, one that controls the chip in a normal fashion also called functional mode or one that controls the I/O cell to perform tests, also called test mode. While this is a generic representation of a chip pin, it may be shared in a number of ways with other pin logic. For example, a core input pin may be sourced from multiple pins and thus may need to be multiplexed with multiple core inputs 224.

While integrated circuit functional complexity keeps growing, the number of I/O pins on a package hasn't been keeping pace, and the complexity of the I/O ring has had to compensate. Many chip manufacturers are resolving multiple-application requirements into single chip solutions and are giving their customers a menu of chip interfaces to choose from. Increasing gate density allows more functionality to be implemented in these devices and the number of available pins imposes limitations.

Next generation I/O requirements are leading us away from the traditional perspective of an I/O ring with a few hundred silicon gates to a complex and interdependent "I/O fabric" with requirements driven from many hardware design disciplines. Traditionally, in integrated circuit chip design, the I/O ring was a top-level component within which all I/O related logic was instantiated. Typical components included I/O cells, boundary scan registers (BSRs), some minor pin multiplexing and other glue-logic type of functionality. Indeed, the I/O integration task is on the critical path of many chip designs. With increasing I/O layer complexity, device pins are heavily bound within a pin-limited package. There is extensive sharing of pins for functional and test purposes. With this growing complexity, the I/O ring is evolving into an I/O fabric that needs to allow full utilization of pin resources and balance constraints from a multitude of sources including functional, DFT, timing, power, die and package constraints.

A device pin is a physically limited resource. While it really can only be one thing at one time, in a chip with multiple applications, it may have different functions. The pin may also need to be utilized by test equipment to gain access to the internal test infrastructure. The internal chip core functions may require two to four times the number of available device pins leading, to complex many-to-many multiplexing scenarios. As a consequence, a single device pin may have several functional modes as well as several test modes, all with their own timing and power requirements. To overcome this limitation the I/O fabric has to be highly configurable. The configuration scheme has to be balanced to ensure that the selection of one interface can co-exist with several others and this leads to some interfaces having sets of I/O pins in different configurations. This many-to-many I/O mapping leads to I/O pins having several system functions and several test functions. Some approaches exist in the industry which use time-division multiplexing to reduce the number of pins between devices, but where chips need to connect to specific devices, this approach is not satisfactory. With pin-sharing, it may be that different pins have different timing requirements.

All device pins require I/O circuitry, typically known as an I/O cell, which drive signals out of the chip or inputs into the chip. I/O cells typically have directional attributes so they can be input, output or bidirectional. There may be other types of functionality e.g. open collector, analog etc. I/O cells themselves are becoming more complex and therefore require more fine grained control to account for process, voltage and temperature variation in the manufacturing process and operating conditions of the device. The complexity of the I/O cells are increasing in order to take into account specific control requirements such as pull-up/pull-down (PUPD), Load Control/Slew rate, Input Enable, Wakeup, output current strength, bus hold and signal termination control. Each of these I/O cell control functions requires the insertion of specialized control logic per pin into the I/O Fabric. Serial interface protocols also play a part in additional complexity such as Utopia IV, SPI-4.2, SFI-4, and 10 Gigabit Ethernet. Different types of I/O cells such as multi-pad I/O cells, Analog I/O, low-voltage differential signaling (LVDS), Double Data Rate (DDR) I/O cells have emerged to handle these various interface protocol requirements. These requirements have increased the complexity of the I/O cells significantly and thus the control logic needed for these I/O Cells. FIG. 3 shows a typical bidirectional I/O cell 400 with an output 412, and an output enable 414 which are used to drive the output onto the device pin 116. The value on the device pin can also be used as an input to the chip and driven as a core input 416. This I/O cell also has pull-up/pull-down control 410 which can be used to enable pull-up/pull-down resistors internal to the I/O cell. There may be additional control signals 418 to control such things as power and slew rate.

To comply with complex DFT (Design for Test) requirements, additional logic needs to be added to chips in order to ensure that they can be properly tested. This results in additional logic being added to the I/O fabric in the form of test multiplexing, Boundary Scan (BSR) logic and test logic to implement testing. The boundary scan chain logic provides a mechanism to test interconnects between and within integrated circuits without using physical test probes. FIG. 4 shows a typical BSR Cell. Essentially, a BSR cell it inserted across a pin data path. On an output path a core pin destined for an I/O cell is connected between the BSR's data_in 510 and data_out 512. In normal mode of operation, data_out is equal to data_in. However in test mode (setting mode 514 to 1) the data_out can be driven from a hold register which can be set at a specific value by test circuitry using a BSR scan chain. By controlling BSR cells inserted on outputs and output enables, the actual I/O cell functionality or even circuitry external to the chip can be tested. A BSR cell can also be inserted on the input path and allow control and observability of input pins. BSRs may also be put on I/O Cells control paths 418.

For functional requirements, the multiplexer logic generated for a given device pin needs to take into account timing sensitive signals and logic.

For power requirements, power-sensitive devices are becoming much more prevalent. Power sensitive devices have increasingly granular power islands which can be turned off in order to conserve power. In a power-sensitive device the physical view of the system is very different to the functional view and this can seriously impact the chip infrastructure as low power design techniques require rethinking of the entire IC design flow. Power reduction and I/O cell power optimization is a key target within most SoC design methodologies. Power optimization can result in the transposing of another layer of logic and control within the I/O cell, and correspondingly the I/O ring, including the insertion of power isolation cells and voltage level shifters.

When considering that the granular multiplex and control circuitry for a single chip pin may be extensive, the problem is exacerbated when there are hundreds or thousands of pins and where the requirements may change frequently. Prior approaches to integrated circuit design have involved manually coding the specific logic required for each pin and potentially sharing functional and test logic implementation between several teams. Manual coding of incrementally changing I/O requirements leads to poorer design quality and high consumption of design resources to design and verify the I/O ring. Also the turn-around time between a requirements (specification) change and a resulting change in the I/O ring implementation (circuitry) could be excessive.

Generally, many prior pin-sharing approaches focus on the switching mechanism that decides who gets control of the resource. The switching mechanism can either be done on time cycle (TDM), or by some level of handshaking between two chips but this would mean that both chips need to be designed with this mechanism in mind. This falls down however when a chip has to be connected to different devices that may not be aware of any pin sharing protocols.

Objectives

The invention is directed towards achieving improved integrated circuit design and improved I/O rings to address at least some of the above problems. Objectives include:
- generation of an I/O layer that can be derived from a single-source specification which can handle a large range of I/O requirements; and/or
- achieving a higher level of design automation; and/or
- improved coherency or design-rule checks on the specification that ensures that the specification is correct and the generated implementation will also be correct-by-construction, achieving fewer bugs, less verification, and less corresponding delay.

SUMMARY OF THE INVENTION

The invention achieves at least some of the above objectives by capturing, in an automated tool, an extensive range of I/O requirements in a generic fashion and automating design of an I/O layer.

The invention provides a method of generating a design for an I/O fabric of a target integrated circuit having a core and pins, the method being performed by a programmed computer operating as a process tool executing algorithms to generate a synthesizable representation of the I/O fabric ring in hardware description language. The method comprises the steps of:

- importing integrated circuit design data,
- from said design data, capturing I/O specification data for the core, cells, pins, I/O control, BSR and I/O cell chaining, and die for the target integrated circuit.
- validating said specification data, and
- from said validated specification data, generating the I/O fabric design.

The latter is achieved in a preferred embodiment by synthesizing, configuring and inter-connecting multiplexers in a cascaded arrangement according to constraints for signal control and timing, wherein a control matrix structure is realized for each pin on both the input and output paths for the following logic types:
- a functional multiplexer matrix structure,
- a test multiplexer matrix structure,
- an override matrix structure,
- a multiplex select and control matrix structure, and
- I/O cell control logic.

In one embodiment, a required pin input and output path logic is configured by modification of the I/O specification data, and/or modification of a manner of wiring of the algorithms, and/or by modification of the algorithms.

In one embodiment, the tool wires algorithms according to a wiring framework, and said wiring framework is modified.

In one embodiment, the output path for a chip pin is sourced during the method from any number (1 . . . n) of functional or test core pins, there being different pin functional or test modes for at least some different sources and comprising the step of dynamically selecting a functional or test core pin for an output pin, wherein the selection for a given logic type controls an individual chip pin, a group of related pins or globally all chip pins.

The output path of a chip pin may be dynamically controlled during the process from any number of pin (0 . . . n) output overrides, in which an override is enabled by a Boolean logical equation of signals existing within the chip.

In one embodiment, the method applies control by setting values in the override matrix structures comprising any or all of:
- forcing a value on an output pin, including controlling pull-up/pull down logic,
- allowing an override to output a pin logical value or the value of any signal within the chip,
- allowing an override to have the ability to control the output enable of an I/O cell,
- forcing logic into a test mode,
- forcing logic into a functional mode,
- an override having an inherent priority in which one override can override another, and/or
- allowing a priority to be specified by a user.

In one embodiment, the method comprises performing timing optimisation for functional or test output path multiplexer logic, in which for each chip pin a priority ordering of input signals to the multiplexer is created to determine timing priority through said multiplexer.

Preferably, control priority of a given logic type in the I/O fabric is configurable.

In one embodiment, the tool's default configuration is that overrides have precedence over test multiplexing, which has precedence over functional multiplexing.

In one embodiment, timing priority of a given logic type in the I/O fabric is configurable, and the tool's default configuration is that functional multiplexing has precedence over test multiplexing, which has precedence over overrides.

In one embodiment, the method comprises generating a behavioral description of a multiplexer, and combining said multiplexer behavioral descriptions in a cascade of logic to provide the I/O fabric design.

In another embodiment, the method comprises the steps of automatically replacing the generated behavioral description with a structural multiplexer cell instance from a library, extracting conditional statements from the behavioral multiplexer description and assigning them a numeric vector based on their priority, and using said numeric vectors to select the input logic signal which will be driven on the output of the structural multiplexer cell.

In one embodiment, in the method:
required pin input circuitry is configurable,
a core input is a functional or test core pin,
a core input is sourced from multiple chip pins, each having an associated prioritization, and each having an associated selection control signal,
a core input is dynamically controlled from any number of prioritized pin (0 . . . n) input overrides, wherein an override can be enabled by any logical equation of signals existing within the integrated circuit including: forcing a logical or signal value on a core input pin, and
a core input pin is protected if no chip pin or input override is selected, wherein the protection value is either a logical value, a signal value, or a chip pin when the core pin is only assigned to a single chip pin.

In one embodiment, the prioritization of the chip pins multiplexed on a core pin input path is determined based on logic type, with the lowest mode number within the logic type taking precedence, and if the input core pin is in the same mode for the logic type on different chip pins then the highest ordered chip pin will take precedence.

In one embodiment, the logic of the I/O fabric is tagged according to power domains, and thus the inputs and outputs of the multiplexers have an associated power domain, and multiplexers are fragmented on the basis of the power domains.

In one embodiment, in the method:
the logic of the I/O fabric is tagged according to power domains, and thus the inputs and outputs of the multiplexers have an associated power domain,
the output path core pin multiplexers whose input signals have different domain references are fragmented into two stages,
a new multiplexer is created in a first stage per unique domain reference which has more than one input signal belonging to it,
the outputs of the first stage are multiplexed into a second stage along with the output from any preceding logic in the cascade of logic, and
the combination of multiplexer logic fragments is logically equivalent to the original un-fragmented multiplexer.

In one embodiment, I/O control override equations are used to control and configure the I/O cell used by a chip pin, equation definitions are re-used by substitution of dynamic information, and the resulting logic, when equivalent, is shared by multiple I/O cell control ports.

In one embodiment, the tool generates the behavioural description for test or functional output signal multiplexer logic by performing the steps of:
creating the output multiplexer and setting the default value of the multiplexer to LOW, for each of a plurality of pin modes, either functional or test, sorting in order of priority: and if the pin's mode has core pin output then selecting the core pin output signal when the control signal for the logic type equals the current mode, and if the pin has preceding logic in the cascade of multiplexers then ensuring that an output enable signal for preceding logic is not enabled, and
if a pin has preceding logic in the cascade of multiplexers then selecting its output value when the output enable signal for this logic is enabled, In one embodiment, the tool generates the behavioural description for test or functional output enable signal multiplexer logic by performing the steps of:
creating the output enable multiplexer and setting the default value of the multiplexer to OUT_OFF,
for each of a plurality of pin modes, either functional or test, sorting in order of priority:
if the pin's mode has core pin output but the core pin's output enable (OE) signal's polarity is not equal to the I/O cell's OE polarity then invert the core pin OE signal's polarity,
if the pin's mode has core pin output and the core pin has an OE signal then selecting the core pin's OE signal when the control signal for the logic type equals the current mode, and if the pin has preceding logic in the cascade of multiplexers then ensure that the OE enable signal for preceding logic is not enabled,
if the pin's mode has core pin output and the core pin does not have an OE signal then selecting OUT_ON when the control signal for the logic type equals the current mode, and if the pin has preceding logic in the cascade of multiplexers then ensure that the OE enable signal for the preceding logic is not enabled, and
if the pin's mode has core pin input then selecting OUT_OFF when the control signal for the logic type equals the current mode, and if the pin has preceding logic in the cascade of multiplexers then ensure that the OE enable signal for the preceding logic is not enabled,
if a pin has preceding logic in the cascade of multiplexers then select its OE value when the OE enable signal for this logic is enabled, In one embodiment, the tool generates the behavioural description for an enable signal selection multiplexer by performing the steps of:
creating the enable signal selection multiplexer and setting the default value of the multiplexer to disabled,
for each of a plurality of pin modes, either functional or test, sorting in order of priority:
if the pin's mode has core pin output then selecting enabled when the control signal for the logic type equals the current mode, and
if the pin has preceding logic in the cascade of multiplexers then selecting enabled when the logic enable signal for the preceding logic is enabled.

In one embodiment, the tool generates the behavioural description for input override multiplexer logic by performing the steps of:
creating an input override multiplexer and setting the default value of the multiplexer to LOW,
for each of a plurality of core pin input overrides, sorting in order of priority:
if the input override type is ONE then selecting a HIGH override value when the override enable control signal is enabled,
if input override type is ZERO then selecting a LOW override value when the override enable control signal is enabled, and
if input override type is signal, selecting override drive signal override value when override enable control signal is enabled.

In one embodiment, the tool generates the behavioural description for input multiplexer logic by performing the steps of:
creating an input multiplexer and setting the default value of the multiplexer to be the core pin's input protection value,
for each of a plurality of functional modes and then for each of a plurality of chip pins:
if a core pin is multiplexed in the functional mode then selecting the chip pin when the current chip pin's functional control signal equals the current functional mode, and
for each of a plurality of test modes if the current chip pin has multiplexing in the current testmodes on the current chip pin, then ensure that the chip pin's test control is not equal to the current test mode, and
for each of a plurality of test modes and then for each of a plurality of chip pins:
if a core pin is multiplexed in the current test mode then selecting the current chip pin when the current chip pin's test control signal equals the current test mode.

In another aspect, the invention provides a computer readable medium having a computer readable program code embodied thereon, said code being adapted to implement, when executing on a digital processor, the steps of a method as defined above in any embodiment.

In a further aspect, the invention provides a data processing system comprising a digital processor, memory, a storage device, and input and output interfaces and the processor being adapted to perform a method as defined above in any embodiment In a still further aspect, the invention provides an integrated circuit having a core and pins and an I/O fabric with multiplexers, wherein there is different logic on pin output paths and pin input paths, there is a cascaded multiplexer arrangement to achieve control priority and timing priority for functional, test and override logic types: wherein the multiplexer arrangement provides:
maximum control priority for override logic signals,
second highest control priority for test logic signals,
lowest control priority for functional logic signals,
maximum timing priority, having the shortest path, for the functional logic signals,
second highest timing priority for the test logic signals, and
lowest timing priority for the override logic signals.

In one embodiment, the multiplexer arrangement for each logic type in the overall cascaded multiplexer arrangement is implemented in first and second multiplexer stages, wherein:
the first multiplexer stage comprises solely of the logic signals for the logic type,
the second multiplexer stage combines the output of the first stage with the output of the preceding logic type, where the preceding logic type is so defined based on timing priority, and
the order of prioritization of signals into the second stage multiplexer is based on priority of control.

DESCRIPTION OF THE INVENTION

Brief Description of the Drawings

The invention will be more clearly understood from the following description of some embodiments thereof, given by way of example only with reference to the accompanying drawings in which: —

DETAILED DESCRIPTION OF THE EMBODIMENTS

Overview of Process

Figure 1:
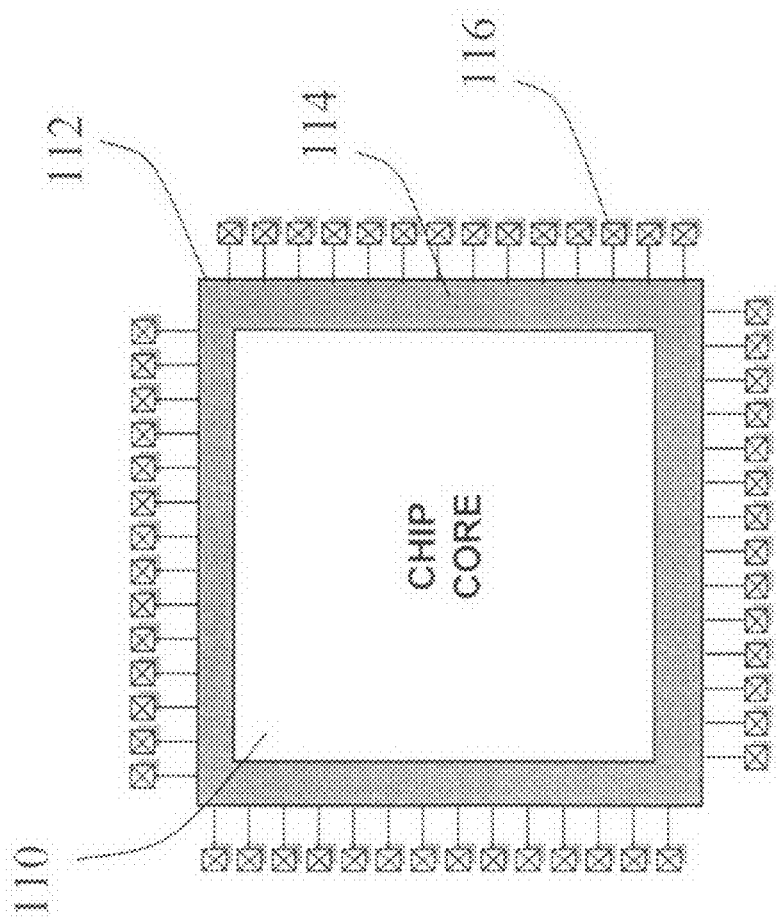
FIGS. 1, 2, 3 and 4 are diagrams representing the prior art, as discussed above.
Figure 2:
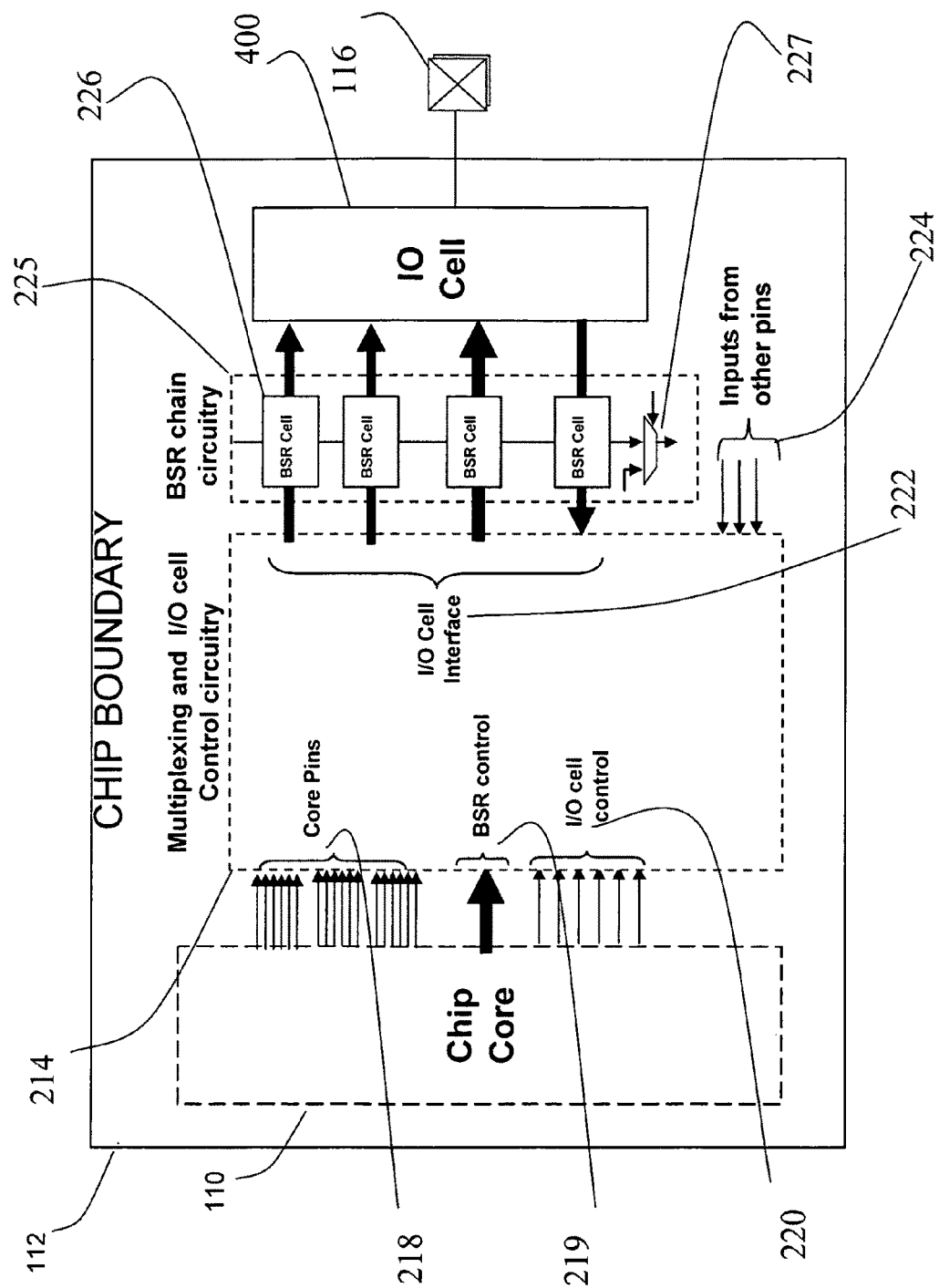
Figure 3:
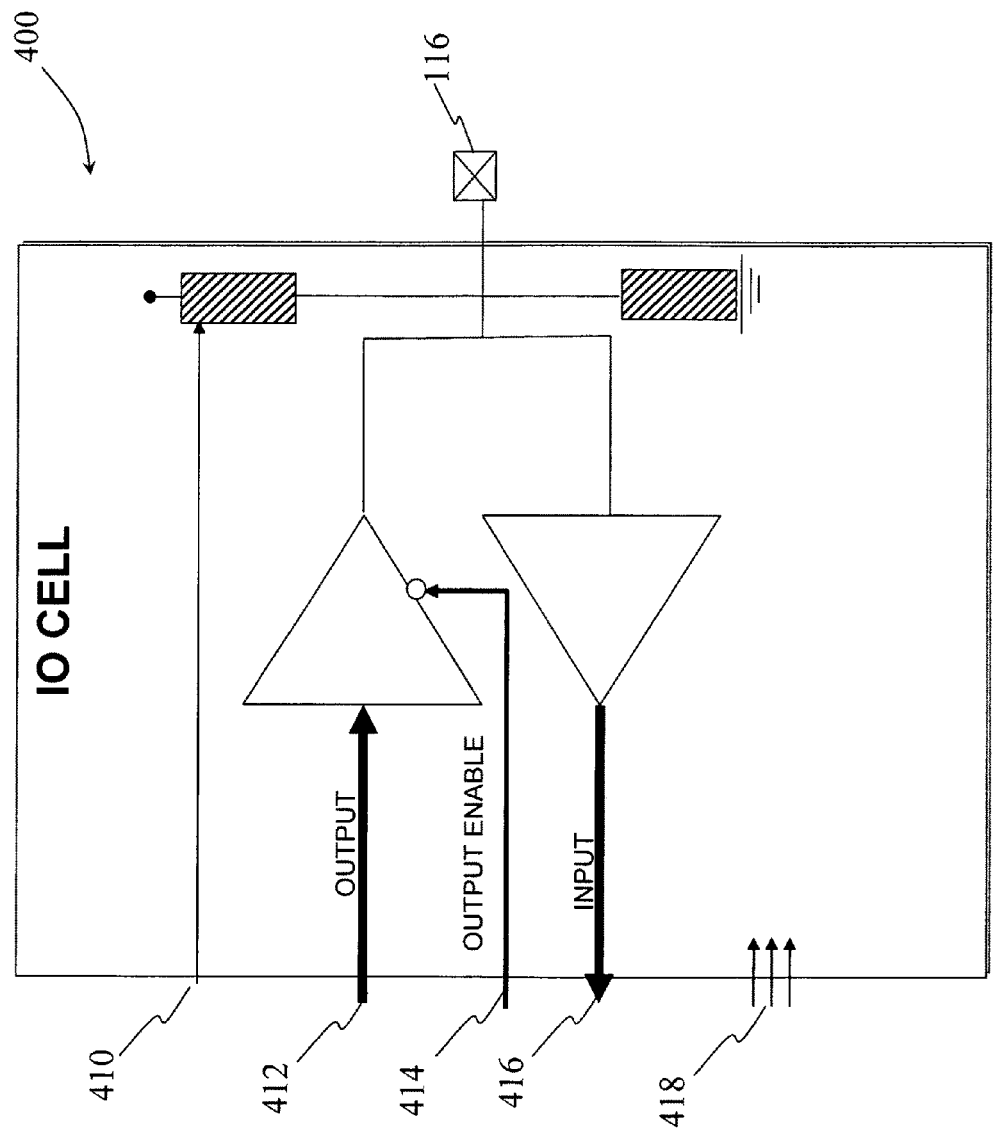
Figure 4:
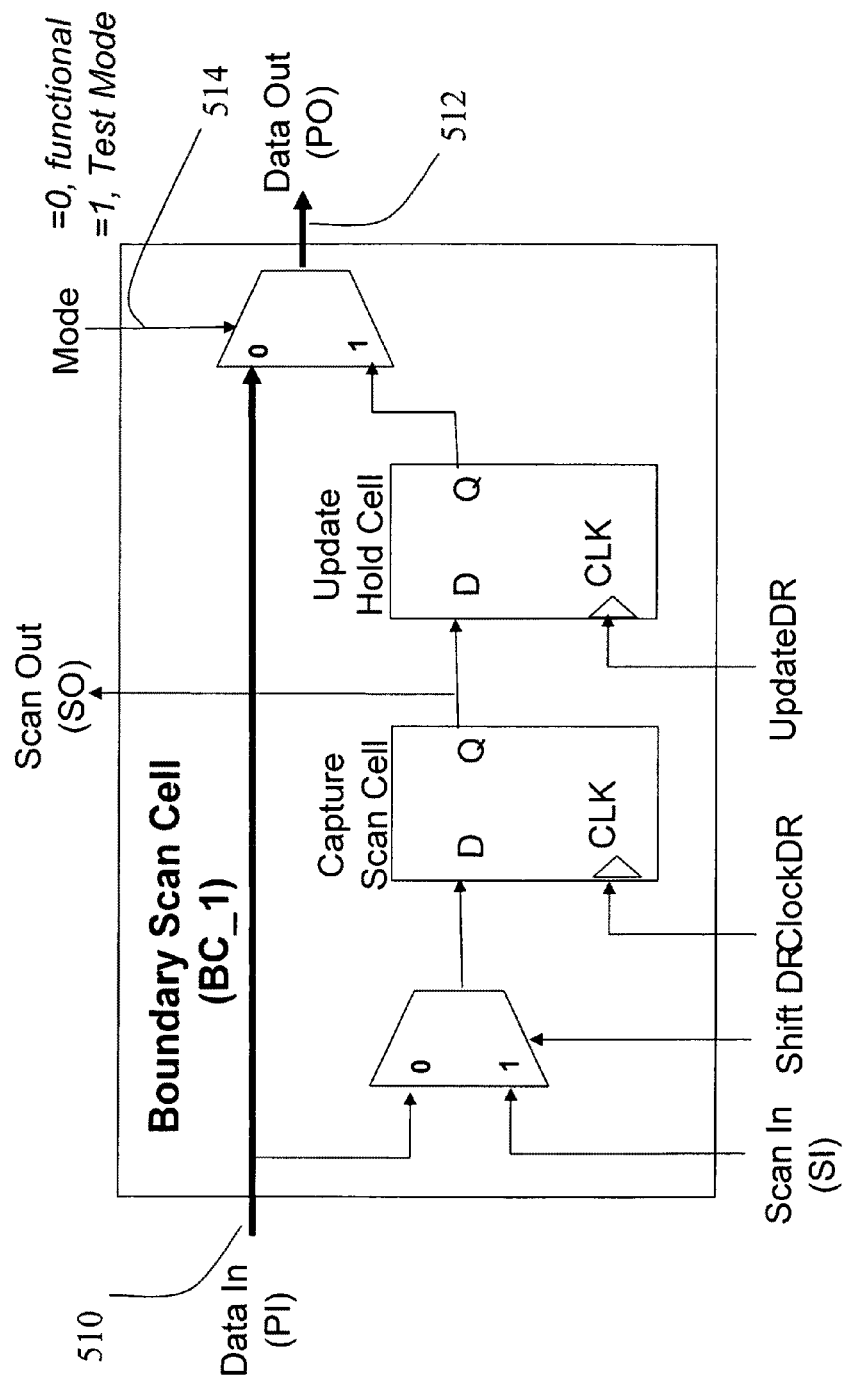
Figure 5:
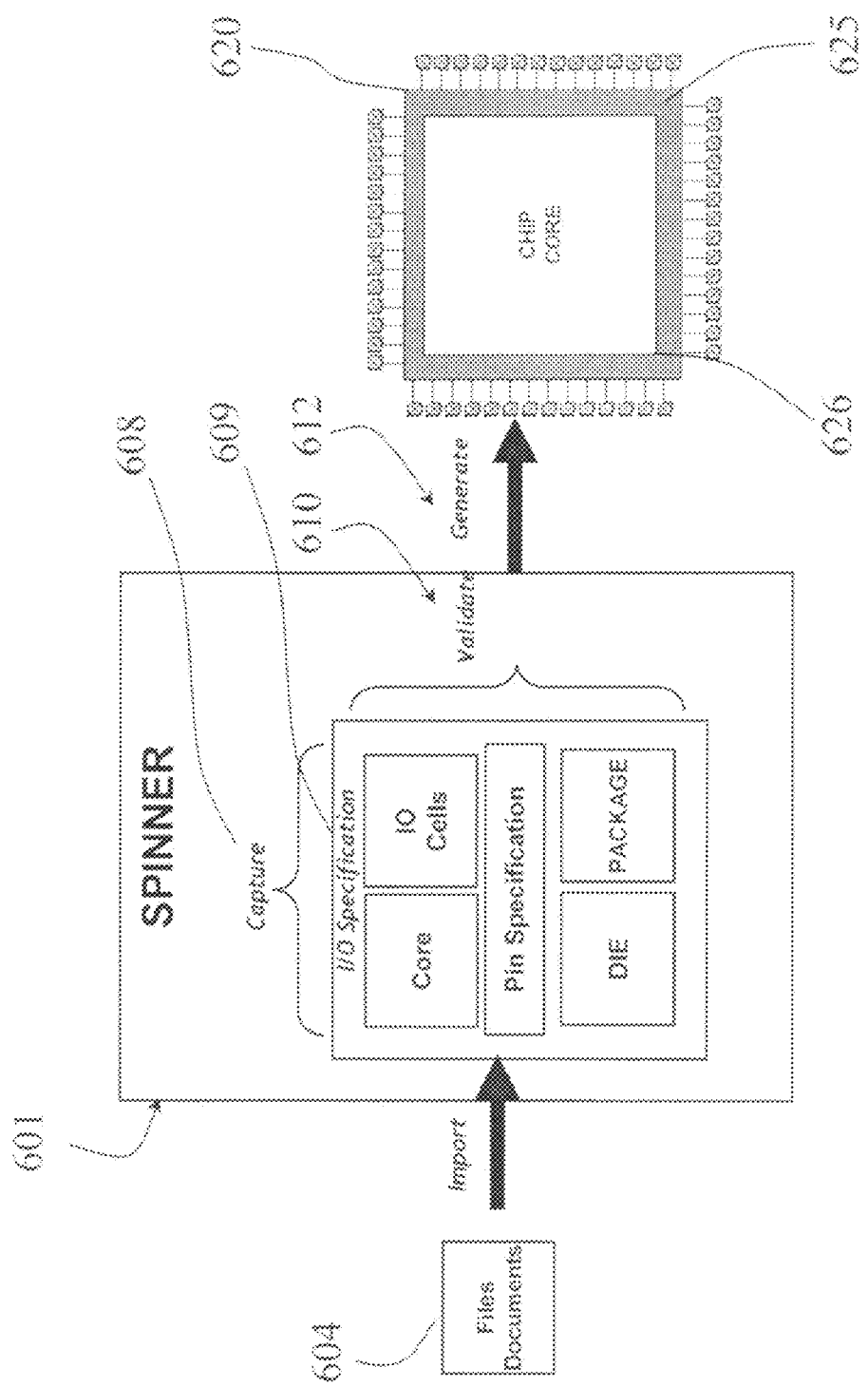
FIG. 5 is a flow diagram illustrating at a high level operation of a tool for importing IC requirement documents, allowing the user to capture additional I/O specification information and to generate an I/O fabric design with a high level of automation.

Referring to FIG. 5 a tool "spinner" 601 captures 608 from imported documents 604 and user input an I/O specification 609 including a core specification; library of cells; pin specification; I/O control specification; BSR and I/O cell chaining specifications; and die and package specification. The I/O specification can be captured directly by a user in the tool 'spinner' 601 or imported from external sources. There may be various sources 604 of information e.g. HDL (VHDL or Verilog™) files describing I/O cells, or Excel™ sheets having pin multiplexing information. The tool validates 610 the specification 609 for coherency and generates 612 a design for an I/O fabric 625 of a chip 620. The tool not only generates the I/O fabric (or "ring") 625 but also the chip 620 top-level design and hook-up to the internals of the chip core 626.

The core specification involves describing the core pins which are available to be multiplexed in functional and test modes. A core pin is designated as being either a functional or test core pin. The signal paths supported by the core pin are described along with the type and polarity of any associated output enable. Each core pin is assigned a protection value, a set of prioritized input overrides and a domain property. As part of the generation step the tool 'spinner' will automatically infer all necessary control signals on the core interface however users can also capture these directly if desired.

The library of cells contains the interface description for I/O, BSR and Structural Mux cells used in the I/O Fabric. The interface ports of the cells are annotated with a function property so that the tool 'spinner' 601 understands how they should be connected. Other cell specific properties can also be captured for example the Joint Test Action Groups (JTAG) Boundary Scan definition language (BSDL) cell type of a Boundary Scan Register (BSR) cell.

For a given pin 116 a user defines the I/O cell 400 to use, the core pins 218 multiplexed in functional and test modes, the priority of functional and test modes per pin; the granularity of control needed for test and functional multiplexing and the prioritized set of output overrides. Users can define three domain properties per chip pin which determines which domain each type of logic created for a given chip pin is grouped in. Users and also specify whether a structural multiplexer cell should be utilized for a given logic type.

The I/O control specification allows a user for all the ports into and out of the I/O Cells for all the pins to define if a BSR cell 226 should be instantiated and the I/O control override equation to use on control ports 418. For the I/O control override equation 419 users can specify the location where the logic should be created and whether a structural multiplexer cell should be utilized.

The BSR and I/O cell chaining specifications allow the user to decide how many chains of a given type should be created and the pins 116 which will be a member of the chain. The chaining order of the pins which are a member of a chain is normally defined by the die pad ordering in the die specification. Each chain definition captures the type of chain; the start pin for the chain; the scan in port for the chain; the scan out port for the chain. A BSR chain also requires that a chain select signal be defined and the JTAG control (TDI, TDO, TMS, TCK, NTRST, RTCK) interface be specified.

For each die pad an associated pin 116 must be assigned. The die pads are assigned geometrical coordinates so that their location on the chip's die can be determined. The die pad ordering used to construct BSR and I/O cell chains needs a direction to be defined (clockwise or anti-clockwise) so that the order of the pins can be determined. Additional backend flow related properties can be defined for die pads. Additional specialized die pads (power, filler, spacer and corner pads) which do not affect the generated I/O Fabric can also be defined. The tool 'spinner' supports the capturing of package related information but this does not affect the type of I/O Fabric 625 which will be generated.

The method performed by the tool generically specifies I/O requirements and generates optimised multiplexing and control circuitry for each of the chip pins on a device. The I/O logic can be fragmented into granular blocks of control logic and regrouped into a new hierarchy in order to facilitate the creation of power domain islands and thus the power partitioning of the chip's logic.

Designs Generated by the Process

Figure 6:
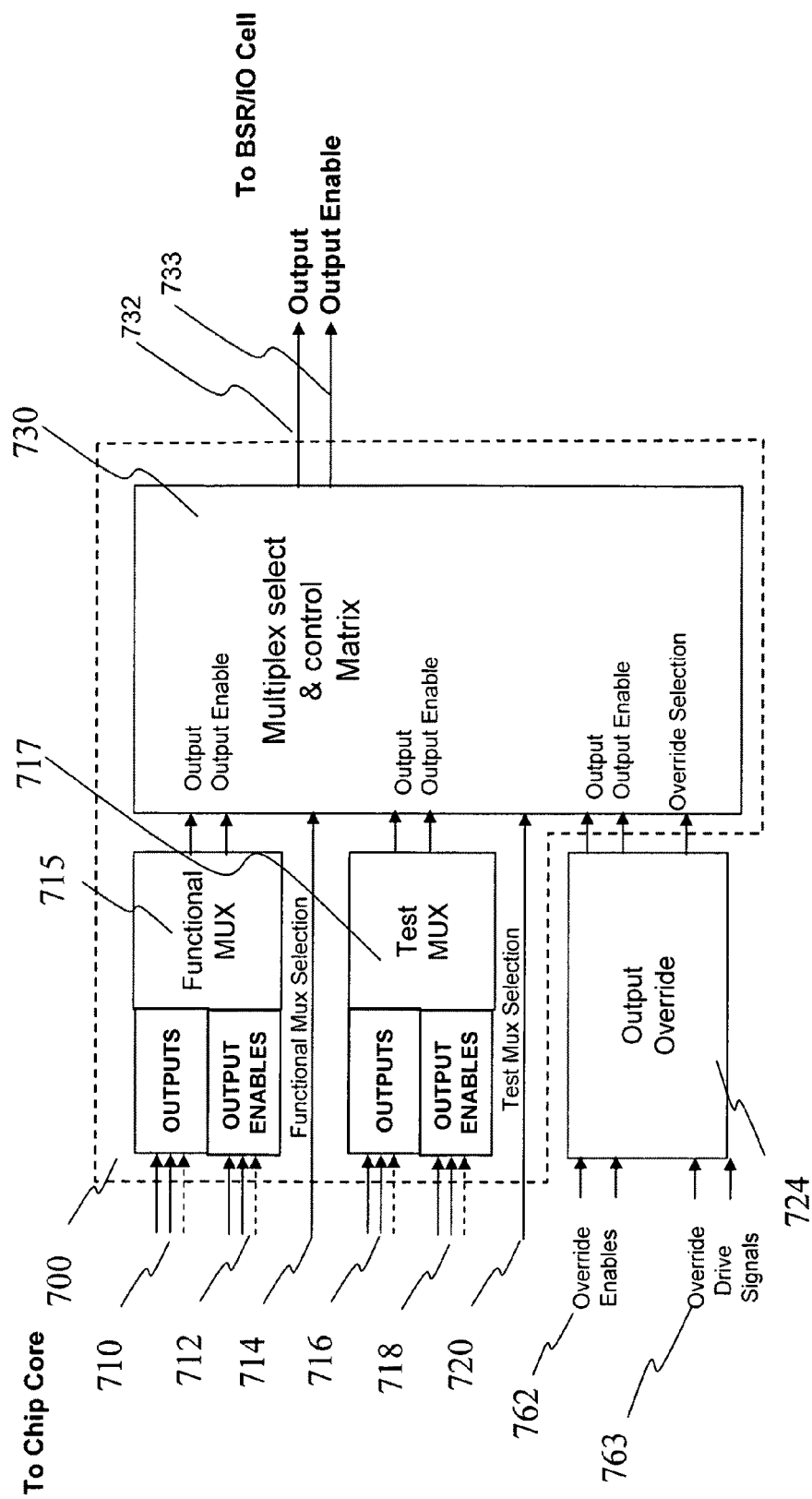
FIGS. 6, 7 and 8 are high level view of a generic pin muxing structure part of an I/O ring developed by the tool, including both input and output multiplexing ("muxing")
Figure 7:
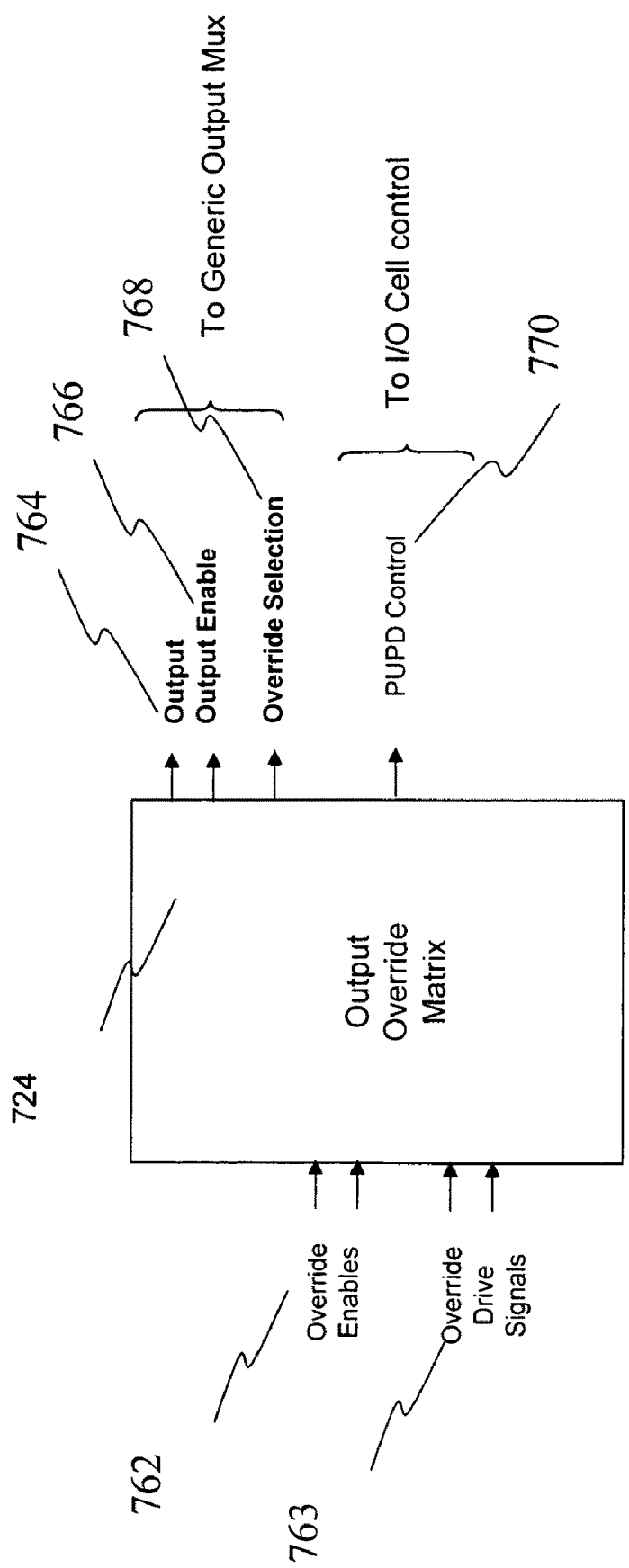
Figure 8:
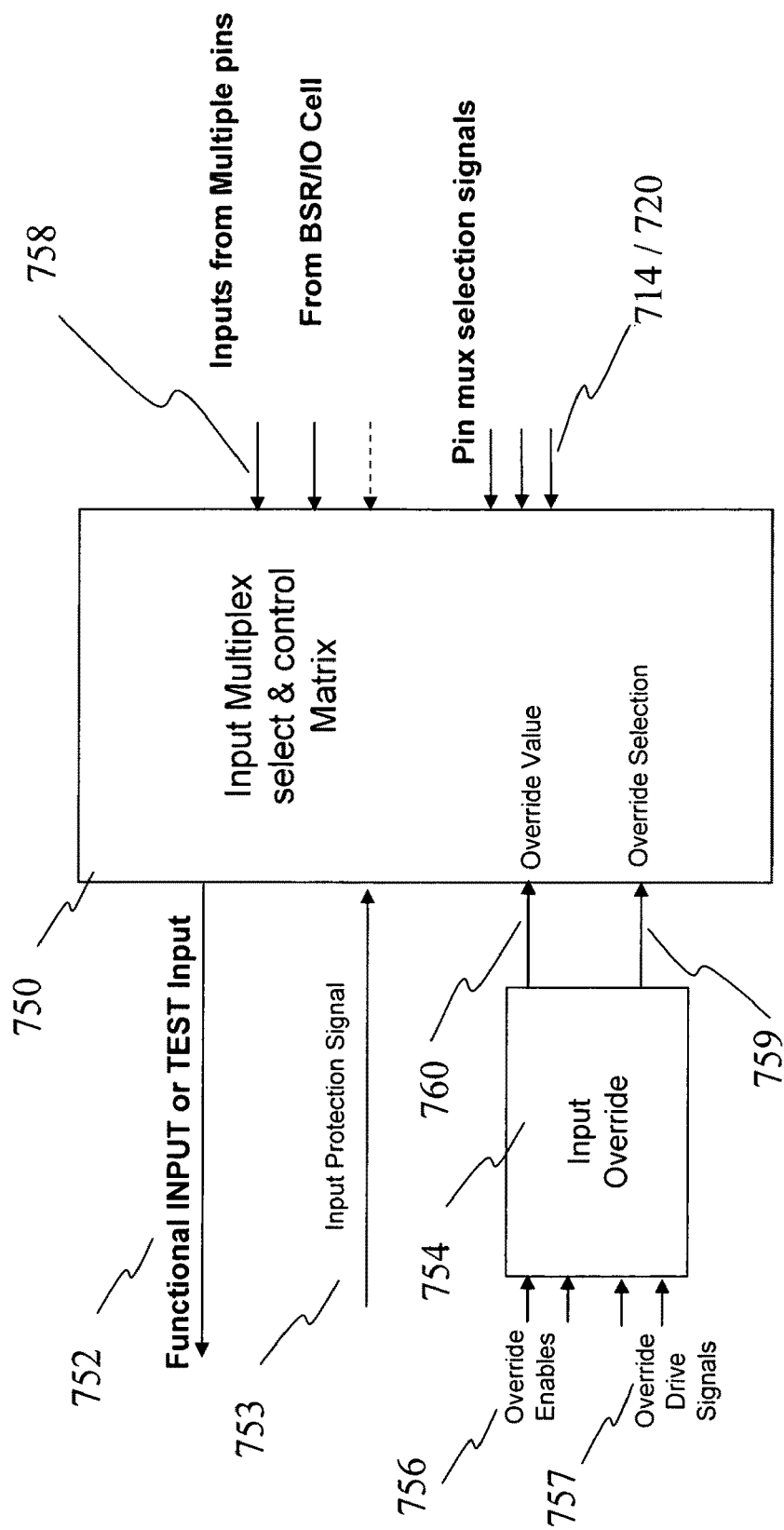

Referring to FIGS. 6, 7, and 8 a set of functional core and test core pins can be selected for multiplexing on a device pin. FIG. 6 shows a generic output pin mux structure 700 generated by the tool. It is represented in the tool as a set of matrices, namely a multiplex select and control mux matrix 730, a functional mux matrix 715, a test mux matrix 717, and an output override matrix 724.

The term "core pin" is an abstraction which refers to three types of signals on the core interface, namely output 710/716, output enable 712/718, and input 752 signals. These three signal paths are referred to as a core pin when they relate to the same functional or test logic inside the core. The table below shows some different types of core pins which are generated:

| Core Pin Type | Comprised of |
| --- | --- |
| Bi-direction with output enable | Output 710/716, output enable 712/718, and input 752 signals. This is a bi-directional core pin with an output enable. |
| Bi-direction with shared output enable | Output 710/716, output enable 712/718, and input 752 signals. An output enable 712/718 signal for this type of core pin is shared by a set of related core pins whose output enable needs to be toggled simultaneously. |
| Output with output enable | Output 710/716, output enable 712/718. This type of core pin does not have an input path. |
| Output with shared output enable | Output 710/716, output enable 712/718. This type of core pin does not have an input path. The output enable 712/718 signal is shared by a set of related core pins whose output enable needs to be toggled simultaneously. |
| Output with no output enable | Output 710/716. This type of core pin does not have an output enable. |
| Input | Input 752 This type of core pin only has an input path. |

The polarity of the Output Enable 710/716 signal can be either active high or active low. Multiplex select and control logic 730 will automatically align to the polarity of an output enable 733 required by the I/O Cell.

As described in the table above it is optional as to whether a core pin is comprised of an output enable signal. If it is multiplexed onto a device pin whose I/O Cell requires an output enable then the multiplex select and control logic 730 will provide logic to turn the output enable ON when this core pin is selected in either the functional or test matrix.

Each device pin has an associated functional 714 and test 720 multiplex selection signal. Collectively, these two signals can be referred to as the device pin configuration signals and are used to configure the multiplex mode of operation of the device pin. The functional mux selection signal 714 determines which functional core pin is selected. Likewise, the test selection signal 720 determines which test core pin is selected. These selection signals can come from the core interface or can be generated from user-specified logic inside the I/O ring 625. The selection mechanism is configurable whereby the functional 714 and test 720 multiplex selection signals can either be global, where signals which affect all device pins; grouped which affect a subset of the device pins or individual which affects each device pin independently. The functional and test selection signals (714/720) are optional in cases where the device pin is dedicated and only has a single functional or test core pin multiplexed.

The set of device pin configurations can be referred to as the overall chip configuration. By configuring each device pin using the mux selection signals one can determine the overall configuration of the device.

A key aspect of this invention is the configuration and generation of a flexible multiplexing and control structure which implements multiplexing of N-N functional or test core pins. This results in multiplexing and control logic on pin output and input paths. FIG. 6 shows such a structure for the output path for a given device pin. The multiplexing is N-N because a single device pin can have multiple core pins multiplexed; likewise a single core pin can be multiplexed onto multiple device pins. The output path for each device pin is made up of a pair of signals namely the output signal 710/716 and an associated output enable 712/718 signal. While the output enable 712/718 signal is not mandatory, the output enable signal going to the I/O cells 733 may be required, so control logic is generated when necessary. An output enable 712/718 signal can be shared by a group of core output pins. The polarity of the output enable 712/718 signal can be different for each of the core output signals which are multiplexed. The multiplexer selection 714/720 signals are used to determine which input into the multiplexer is selected. Separate control logic 814/820 needs to be generated for the output and output enable paths for both functional 715 and test 717 paths.

In FIG. 6, the functional 715, test 717 and override 724 logic are all shown at the same level or order in relation to the multiplex select and control logic 730. It is described below how the multiplex select and control logic 730 can be constructed such that the user can choose a priority of control and timing priority for the three logic types 715/717/724.

FIG. 6 also shows the output override matrix logic used to select the highest priority override which is enabled for the device pin. Each override defined on a device pin will have an override enable 762 which determines if the override is active or not. If multiple overrides are enabled at the same time for a given device pin precedence is given to the order in which they are specified. A device pin can have the same override type assigned multiple times. There are a number of override types where the actual logic value forced by the override is determined via a signal 763. Each of these overrides will have an associated override drive signal 763. The override enable 762 signals and the override drive 763 signals can be driven by complex logical equations which can be placed in the I/O fabric 625 using a custom logic block or else can be driven by logic from inside the core 110. This means that any logical combination can be used to enable an override.

The table below describes the effect of the different output override types 724 on the logic values driven on a given device pin.

| Output Override Type | Effect of Override logic on a device pin |
| --- | --- |
| Zero | The device pin is forced to '0' by turning the output signal 732 to '0', output enable 733 is turned ON and the pull-up and pull-down 770 are turned OFF. |
| One | The device pin is forced to '1' by turning the output signal 732 to '1', output enable 733 is turned ON and the pull-up and pull-down 770 are turned OFF. |
| Signal | The device pin is forced to a signal value by assigning the output 732 to a 'signal', output enable 733 is turned ON and the pull-up and pull-down 770 are turned OFF. |
| Z | This forces the device pin low by turning OFF the output 732, output enable 733, pull-up and pull-down 770. |
| PU | This assigns the device pin high by turning the pull-up ON and pull-down OFF 770, while not affecting the output 732 and output enable 733. |
| PD | This assigns the device pin low by turning the pull-down ON and pull-up OFF 770, while not affecting the output 732 and output enable 733. |
| PUZ | This assigns the device pin high by turning the pull-up ON 770, the output 732, output enable 733, and pull-down 770 are all OFF. |
| PDZ | This assigns the device pin low by turning the pull-down ON 770, the output 732, output enable 733, and pull-up are all OFF 770. |
| PO | The device pin pull-up and pull-down down 770 are both OFF while the output 732 and output enable 732 are unaffected. |
| TestEnableOff | The device pin's test enable signal 820 is driven Low. |
| OutputEnableOn | The device pin's output enable signal 733 is driven to an OUT_ON value. |
| OutputEnable_signal | The device pin's output enable signal 733 is driven to a signal value 763. |
| PUPDZ_signal | The device pin's PUPD 770 is driven to a signal 763 and the output enable 733 is driven to OUT_OFF, and the Output 732 is driven LOW |
| PUPD_signal | The device pin's PUPD 770 is driven to a signal 763. It does not affect the output 732 or output enable 733. |

A further level of timing layout optimisation is provided for the functional 715 and test 717 multiplexer logic. For each device pin the user can select the priority ordering of the input signals 710/712/716/718 to the multiplexer and therefore choose exactly the timing layout through this multiplexer.

FIG. 7 shows the override logic which is provided on the output path. An override allows the output of a device pin to be forced to a defined value when desired. This allows the inclusion of any number of device pin overrides 724 of a wide range of types of override control. Thus, each device pin can have zero or more overrides which can be used to control the output of a device pin. There are multiple different overrides which can be assigned which affect not only the device pin's I/O cell's output 732 and output enable 733 signals but also the I/O cells PUPD control signals 770.

Figure 9:
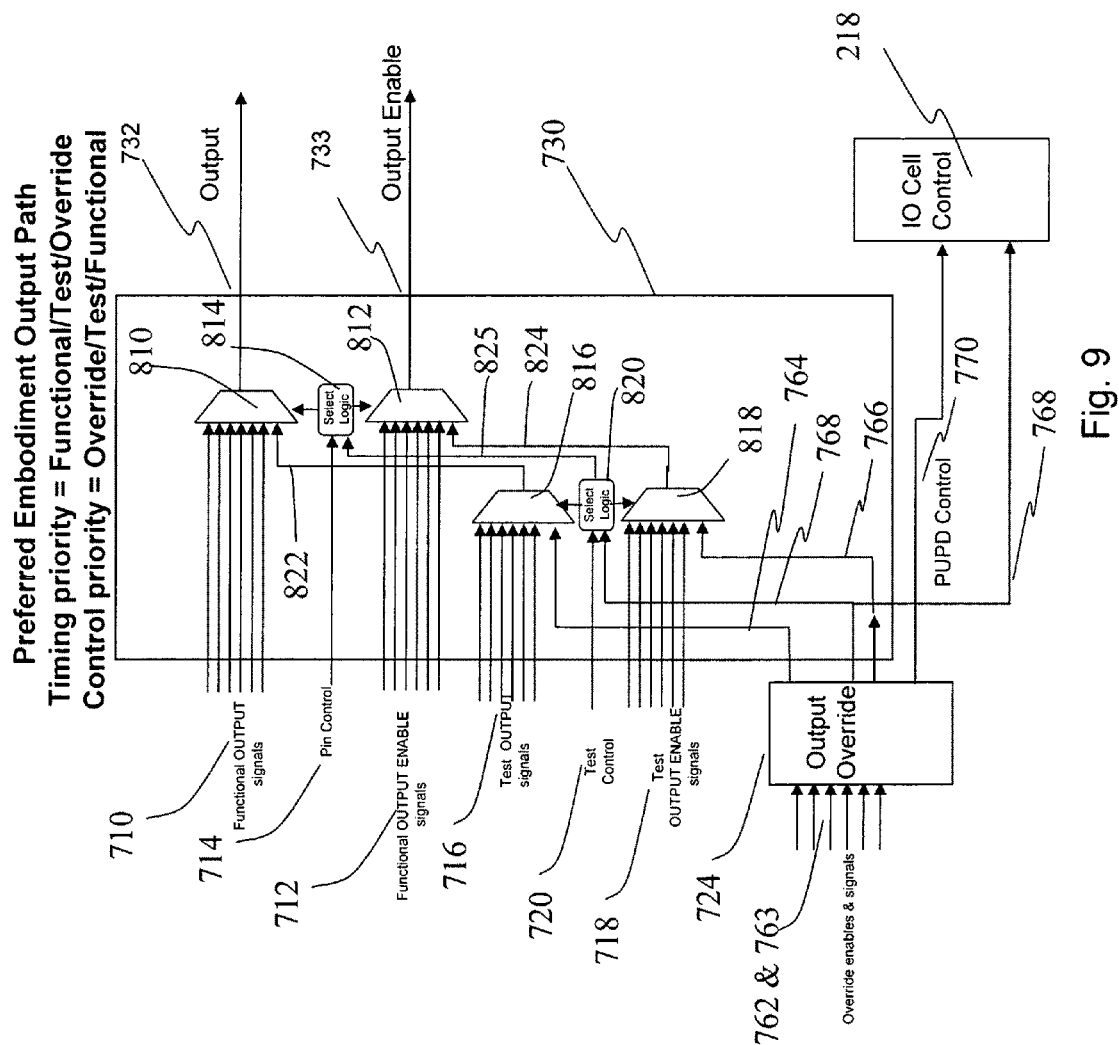
FIG. 9 is a circuit diagram showing the preferred embodiment of the mux arrangements for delivering output and output enable logic to an I/O cell.

When a particular override is enabled for a device pin's output override matrix 724 then the override selection 768 will be ENABLED_ON which ensures that the output signal 764, output enable 766 and PUPD control 770 will be selected through the cascade of device output path logic shown in FIG. 9 and therefore have priority of control over the output 732 and output enable 733 signals logical values as well as the PUPD control 770. The PUPD Control signal is a two bit vector that controls the desired pull value on the I/O Cell output.

The process tool can define an override on chip pin X (which has a bidirectional I/O cell), of type PUZ that is enabled when a hardware port called HIGH_Z on a core interface is active (high). The tool generates the logic such that when a signal called HIGH_Z is active, it will immediately force the output enable inactive and force the PU/PD logic inactive, thereby leaving the output of the buffer high-impedance or as it is known in logical terms—'Z'. This will remain in this condition until the HIGH_Z goes inactive, independent of the functional or test multiplexing.

FIG. 8 shows the multiplex selection and control logic 750 and the input override logic 754 which is placed on a core pin's input 752 path. This input path can be the input path for either a functional or test core pin.

A flexible multiplexing and control structure 750 is generated for the core input path 752. This multiplexing structure is required because of the need to multiplex N-N device pins because a single core input path 752 can be sourced from multiple device pins 758 multiplexed; likewise a single device pin 758 can be multiplexed onto multiple core input paths. The core input pin can be a functional or a test pin.

The input multiplex select and control logic 750 has in this embodiment a multiplexer selection signal 714/720 per device pin input path 758 which is multiplexed onto this core input path 752. The actual number of mux selection signals 714/720 is dependent on the granularity of the mux selection signal (global, grouped or individual) as described above. In the case where multiple device pin mux selection signals are enabled at the same time then the pin with the lowest mode number takes precedence. If the input core pin 752 is in the same mode on different chip pins 758 and their pin mux selection signals are enabled at the same time then the highest ordered chip pin will take precedence.

FIG. 8 shows the input override logic 754 used to select the highest priority input override which is enabled for the core input path 752. Each override defined on a core input path has an override enable 756 which determines if the override is active or not. If multiple overrides are enabled at the same time for a given device pin precedence is given to the order in which they are specified. There are a number of override types where the actual logic value forced by the override is determined via a signal 757. Each of these overrides has an associated override drive signal 757. The override enable 756 signals and the override drive 757 signals can be driven by complex logical equations which can be placed in the I/O fabric 625 using a user defined logic block or else can be driven by logic from inside the core.

The table below describes the effect of the different input override types 754 on the logic values driven on a given device pin.

| Override Type | Effect of Override logic on a device pin |
| --- | --- |
| Zero | The core input path 752 is forced to '0'. |
| One | The core input path 752 is forced to '1'. |
| Signal | The core input path 752 is forced to the value of the override drive signal 757. |

When a particular override is enabled for a core input path's override matrix 754 then the override selection 759 will be ENABLED_ON which ensures that the override value 760 will be selected through the cascade of core input path logic and therefore have priority of control over the core input 752.

A further level of logic is provided in the input multiplexing and control matrix 750 called input protection logic. Because of N-N multiplexing possibilities, it would be possible that for a particular chip pin configuration a specific core input is not used. It is important that if the core input is not used that it is protected from toggling spuriously or given a non-deterministic value as it could cause unknown side effects. The input path needs to be driven by a valid value to avoid undefined logic state when no input multiplex mode is selected 714/720 and no input override 754 is enabled. The process tool allows the user to define the protection value of a core input if it has not been selected. Input protection logic can be considered the lowest priority of control or default logic on the input path. It will be the default condition in the input multiplex select and control matrix 750 and therefore does not require a selection signal. The table below describes the effect of the different input protection types on the logic values driven on a given input path 752.

| Input Protection Type | Effect of Input Protection |
| --- | --- |
| Zero | The core input path 752 is forced to '0' if no other logic type is selected on the input path. |
| One | The core input path 752 is forced to '1' if no other logic type is selected on the input path. |
| Signal | The core input path 752 is forced to the value of the input protection drive signal 753 if no other logic type is selected on the input path. |
| PinProtect | The core input path 752 will take the value of the device pin input path 758. This input protection type is only allowed on core input paths which have a single device pin input path multiplexed. |

Other aspects included in a designed I/O fabric are a) the specific priority of control and b) timing layout of the pin multiplexer and control structures on the output path. The three different types of logic (functional, test, and override) each have different requirements in terms of priority of control and timing layout. Priority of control can be defined as the logic type which will take priority when more than one of the logic types are enabled (active) at a given instance in time. The logic with the highest priority of control will be the logic value driven out on the device pin 732/733 or driven in the core input path 752. Timing layout refers to the number of gates on the logic path and hence the delay that the logic will experience whilst propagating through this part of the integrated circuit.

Referring to FIG. 9, the different logic required on both the device pin output path and input paths results is the generation of a cascaded multiplexer arrangement of the output path multiplex select & control matrix 730, with multiplexers 810/812/814/816/818 to achieve the desired control priority and timing priority for the different logic types (functional, test and override). In this diagram the output override box has not been broken out. This arrangement achieves:

maximum control priority for the override signals 766/764, second highest control priority for test signals 716/718, and lowest control priority for the functional signals 710/712.
maximum timing priority, having the shortest path, namely the functional output signals,
second highest timing priority for the test signals, and
lowest timing priority for the override signals.

The order of priority of control is described based on a default logic ordering (override, test and functional). Where override logic has the highest priority of control and functional logic has the lowest. Likewise, for timing layout in the description of the invention is described in terms of the default timing layout (functional, test and override). In the case of both priority of control and timing layout other realisations of the invention might result in an alternative ordering of the cascaded multiplexer arrangement.

Figure 10:
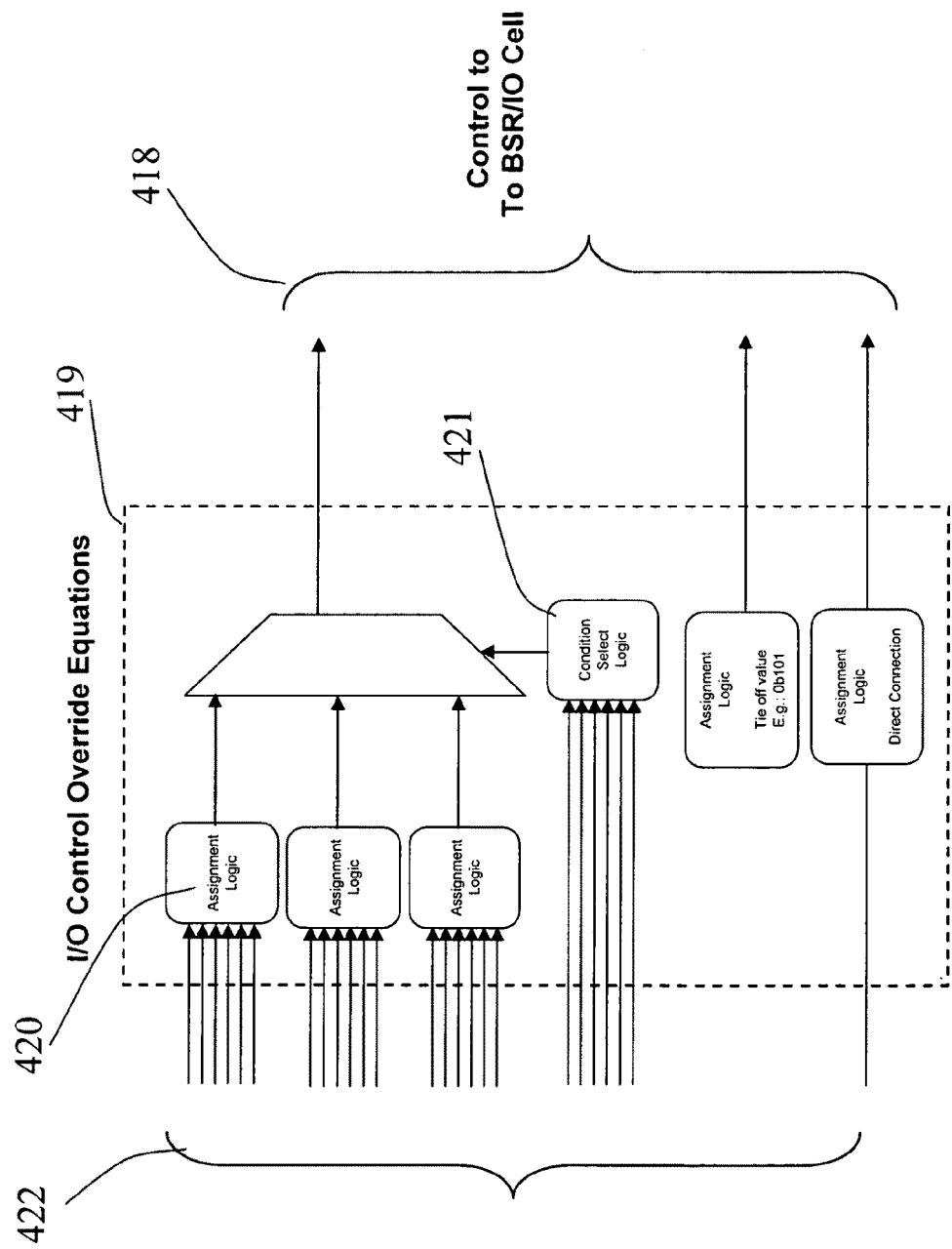
FIG. 10 is circuit diagram showing the type of IO Control Override logic which can be placed on IO Cell control signals.

FIG. 10 shows the I/O control override logic 419 which can be used to control the I/O Cell's control ports 418. These I/O Cell control ports are used to configure and control the I/O Cell so that it can take account of process, voltage and temperature variations in the operating conditions of the I/O Cell 400. They can also be used to control specific algorithms such as slew rate, load control, input enable and others. Each control port 418 on the I/O cell instance 400 for a given chip pin 116 can have an I/O control override equation 419 associated with it. I/O control override equations are defined and then associated with I/O cell control ports thus allowing a single definition to be shared across multiple I/O control ports and I/O cell instances. The process tool provides users with the flexibility to choose for the resulting I/O control override logic whether it should be uniquely created for the given I/O cell or shared by a set of I/O cells.

The I/O control override equations 419 are written in the form of one or more assignment 420/condition 421 statements which can form complex multiplexing structures, tie off equations or direct connections between the I/O cell control port 418 and the core ports 422.

condition?assignment:condition?assignment:assignment

The equation may be a single assignment statement which therefore allows direct connections and tie-off values to be defined. The condition statements should always evaluate to a Boolean value. An equation language used to define the conditions and assignments is made up of:
Identifiers (port names)
Slice ([left: right])
Constants (decimal, binary, octal, hexadecimal numbers)
Operators A set of rules are enforced to ensure that the identifier will result in the creation of a legal HDL identifier. These identifiers declared in the assignment and condition statements are used to locate ports on the core interface 110. A slice or portion of the port can be selected using the slice notation [left:right]. The equation language supports different number formats (decimal 1921, binary 0b101, octal 0o36, hexadecimal 0xfA6) in order to declare constants within the assignment and condition statements. The I/O control override equation's language supports a standard set of operators +, −, *, /, **, %, ~, &, |, ^, ^~, ~^, <<, >>, <<<, >>>, !, &&, ||, ==, !=. Operator precedence can be explicitly defined using brackets.

The equations can contain substitution sites which are designed to allow flexibility in the port names and constants used by the equations. Through the use of substitution sites a single equation definition can be used across multiple I/O Cell ports where the actual control logic that is generated will be unique to the I/O cell port 418. On generation 612 the substitution sites are replaced with dynamic information. The table below describes the available set of substitution sites and the dynamic information with which the substitution site can be replaced by:

| Syntax | Description |
| --- | --- |
| ${pin} | This substitution site will be replaced by name of the chip pin 116 associated with the I/O cell instance 400. |
| ${columnname} | This substitution site will be replaced by the value in the named column for the current chip pin 116 which has been captured in I/O specification 609. |
| ${port} | This substitution site will be replaced by the name of the I/O Cell port 418 which is being controlled. |

Through the substitution sites the user has full access to the tool's application programming interface (API). For example, the equation below accesses the last character in a port name (Id2) for a given chip pin (pinY):

${pin}_sel[${port.nodeName.substring(port.nodeName.length( )−1)}]

When dynamic information is substituted the resulting equation is 'pinY_sel[2]'. In other realisations other possible substitution sites could be provided such as ${iocell} which might be replaced by the name of the I/O cell 400 used on the chip pin.

On generation 612 the I/O control override equations 419 are translated into the required RTL representation and the connections to the core interface 422 and the IO cell control interface 418 are created. The user can choose where the logic should be located. By default it is placed in the chip pin's control component. By specifying a location for the equation logic the user can ensure that the same I/O control override logic can be used to control multiple I/O cell ports and thus helps reduce the amount of logic gates required by the I/O fabric.

Another aspect of the invention is the fragmentation or partitioning of device pin multiplexer and control structures based on power domains which can be used to achieve considerable improvements in energy efficiency. The fact that the logic can be switched off dynamically results in better power efficiency. Unless the logic is fully fragmented it will not be possible to achieve the desired power saving using power design techniques.

Figure 11:
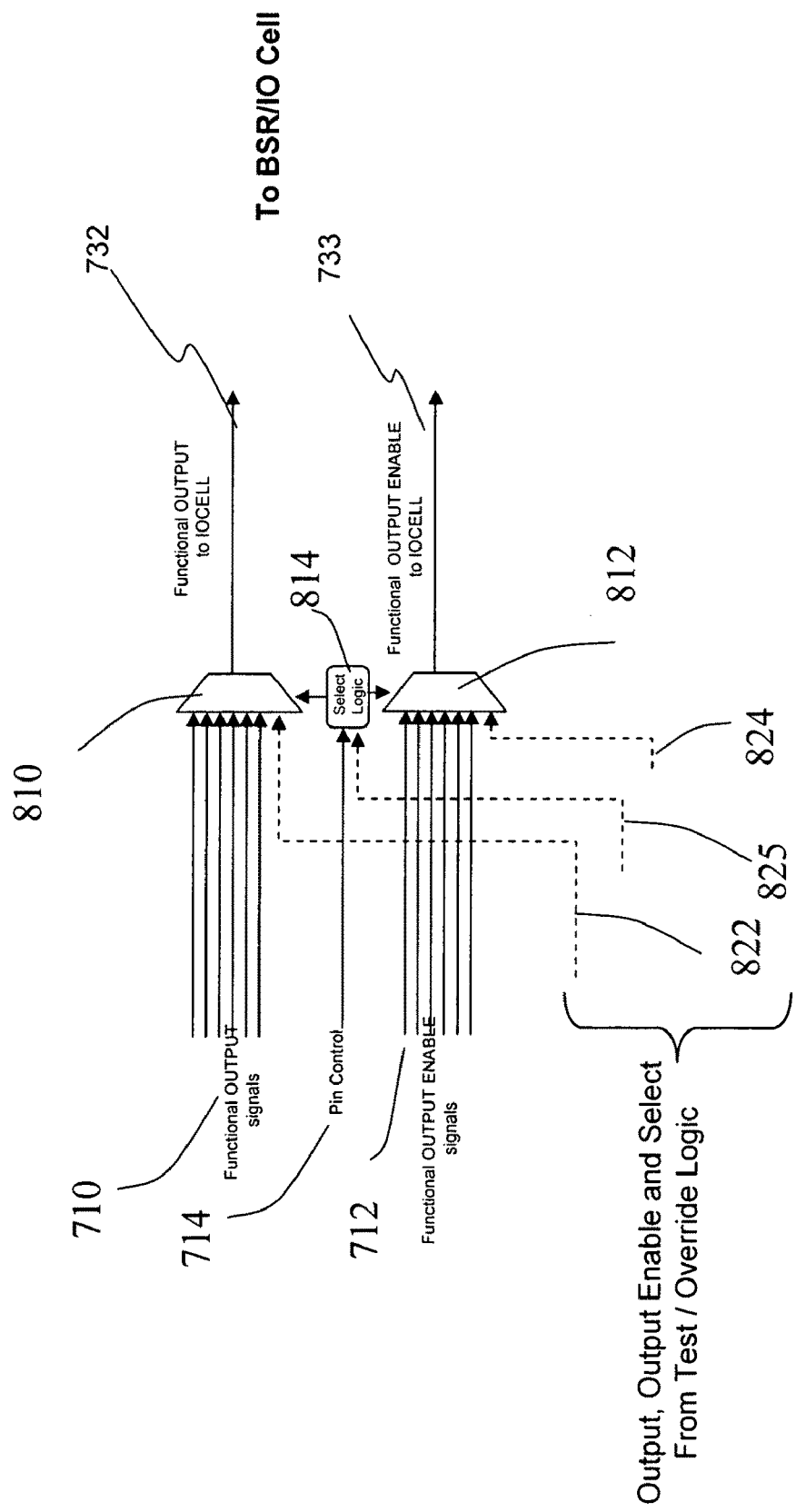
FIGS. 11 and 12 are diagrams showing multiplexing arrangements for fragmentation of multiplexer circuitry according to power partitioning in the core.
Figure 12:
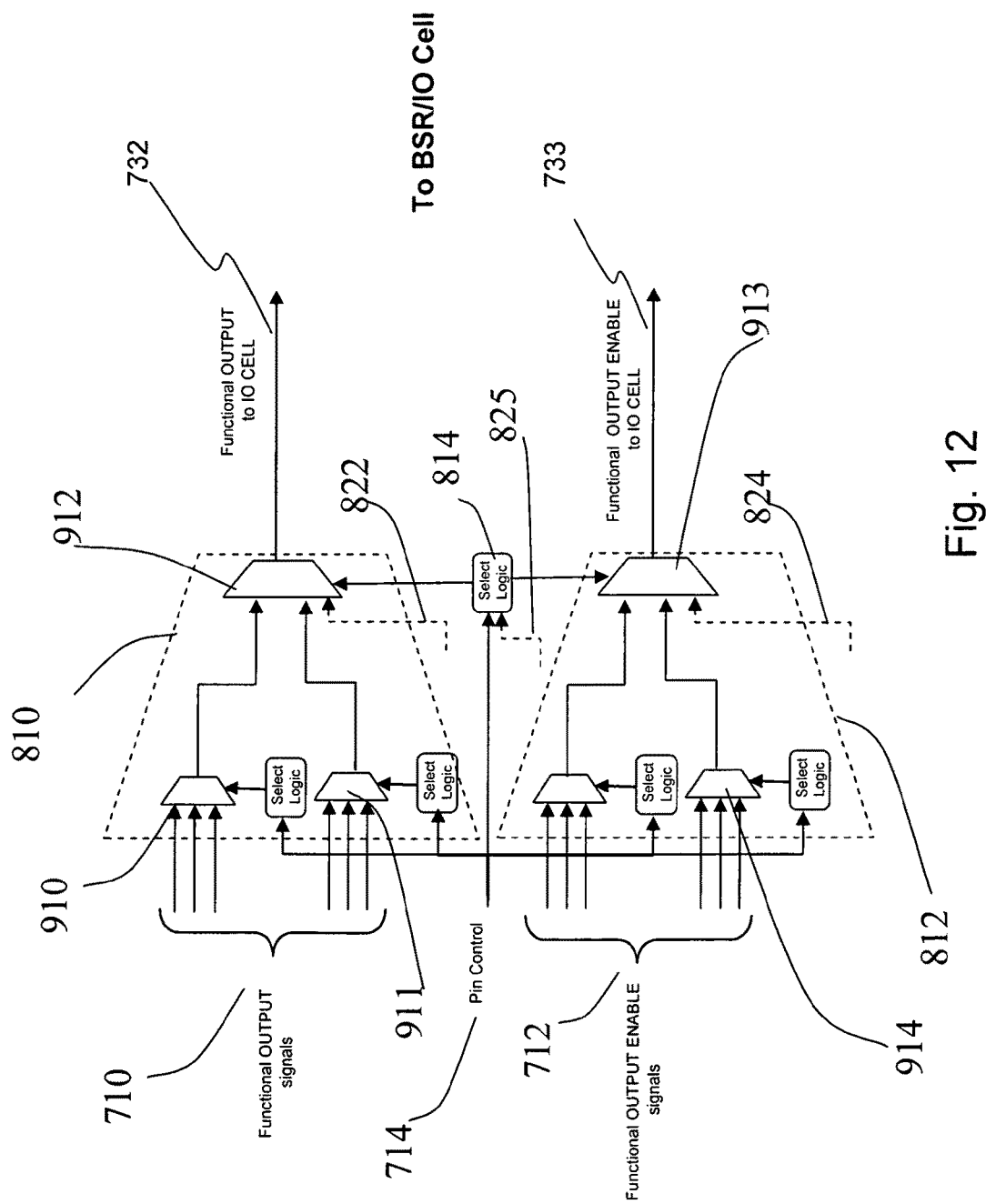

This invention allows pin and input multiplex logic to be fragmented depending on the source domains for each of the possible sources. FIGS. 11 and 12 collectively show how the multiplexer logic can be fragmented by the process tool in order to segment the multiplexer logic into power domains. In FIG. 11 there are six core pin output 710 and output enable 712 signals being multiplexed in a functional output multiplexer 810 and functional output enable multiplexer 812 which belong to two different power domains. The multiplexer logic is constructed as shown in FIG. 11 with no regard to power domain fragmentation. In FIG. 12 the dotted lines represent the original functional output multiplexer 810 and functional output enable multiplexer 812 which have been fragmented across power domain groups. The six core pins being multiplexed belong to two separate power domains. Thus, the output multiplexer 810 is fragmented into two multiplexers 910, 911 to account for the two power domains at the core level. A final multiplexer 912 belongs to the device pin's power domain and is used to combine the selected output from the two core pin domains. Each multiplexer group 910/911 corresponds to an individually switchable domain of the core. This one-to-one mapping allows disabling of the relevant multiplexer circuitry when a core domain is switched off. The device pin domain 912 ensures that a valid value will be driven on the device pin's output path 732 regardless of whether or not all the core pin domains have been switched off or not. The same technique can be applied to the test multiplexer logic 816/818 and the override logic 724.

In order to achieve this fragmentation of the multiplexer logic each output core pin path 710/712 716/718 which needs to be test or functionality multiplexed has a power domain associated with it. Core pins with a common power domain are first multiplexed so that all the multiplexer logic for this domain is in a single block.

This first level of multiplexing is then followed by a second level of multiplexing where this level of multiplexing is in the device pin's power domain. This second level of multiplexing is either the final functional 912/913 or the final test multiplexer.

On a pin-by-pin basis, it is possible to specify three separate power domain properties:

The domain (DL1) for the final functional mux 912/913 and I/O cell.

The domain (DL2) for the BSRs 225 and I/O cell control logic 419.

The domain (DL3) for the final test mux and override logic.

The table below shows the domain property which will be assigned to each of the different types of logic which are generated in the I/O fabric.

power domain. As all this logic belongs to the core pin input path's 752 power domain and therefore it is not necessary to fragment the logic.

The logic fragmentation is designed to make it quite straightforward to create a logic hierarchy based on power domains from the fully fragmented logic. Logic from different device pins which are part of a common power domain can be combined into a logic hierarchy. The process tool allows the desired hierarchy to be generated by allowing logic to be selected depending on its domain or logic type and may be grouped at several different levels to achieve this hierarchy.

Power optimization can then be applied to the resulting power domain partitioned logic hierarchy. These power optimization techniques, result in the transposing of another layer of logic and control within the I/O fabric 625, including the insertion of power isolation cells and voltage level shifters on the power domain logic hierarchy boundaries. In order to make it easier to apply these techniques it is necessary in certain cases to create feed-through component instances so that they can be tagged with a domain property to allow the fore-mentioned power optimization techniques to be applied.

Figure 13:
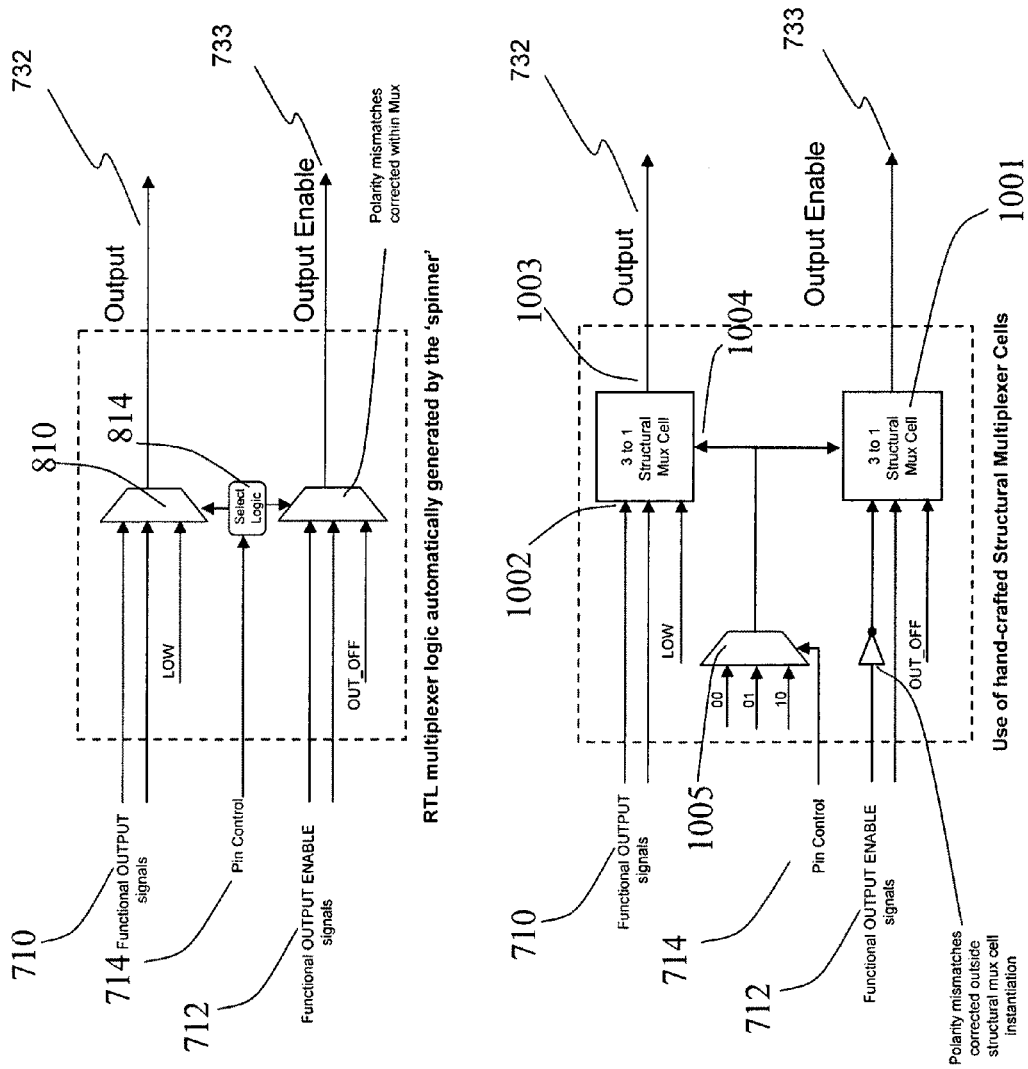
FIG. 13 shows multiplexing arrangements when structural multiplexer cells which contain transistor logic are used in place of RTL multiplex logic automatically generated by the design tool of the invention.

Another aspect of the invention shown in FIG. 13 is the ability to use hand-crafted transistor level logic for timing critical or glitch free paths. RTL to describe the multiplexer logic is automatically generated 612 from the I/O specification 609. This RTL can then be synthesised into actual transistor level gates. For timing critical or glitch free paths it is possible to choose to utilise transistor level logic which has been hand-crafted to guarantee a particular timing constraint is meet in place of the RTL multiplexer logic automatically

| Logic Type | Domain | Comment |
| --- | --- | --- |
| Core pins 710/712/716,/718 | Core pin's DL | Each core pin on the core will have an associated domain property |
| IO Cell 400 | Chip pin's DL1 | The IO Cell instance will be tagged with the Chip pin's DL1 property |
| BSR chain circuitry 225 | Chip pin's DL2 | There may be many BSR cells per chip pin placed across the IO Cell's interface 222 (O 412, OE 414, I 416, PUPD 410, Ctrl 418). All these instances are tagged with the Chip pin's DL2 property. BSR chain selection muxes 227 are used to select the path followed through the BSR chain. A chain select mux 227 will be tagged with the domain of the BSR cell that is connected to the output of the mux. |
| Level one functional multiplexing 910/911 | Core pin's DL | There will be one multiplexer for each separate core pin domain functionally muxed on the chip pin. |
| Level one test multiplexing | Core pin's DL | There will be one multiplexer for each separate core pin domain test muxed on the chip pin. |
| Second level functional multiplexing 912/913 | Chip pin's DL1 | Second level mux of output from all functional core domain muxes and output from test/override logic stages 822/824. |
| Second level test multiplexing | Chip pin's DL3 | Second level mux of output from all test domain muxes |
| Output Override Logic 724 | Chip pin's DL3 | Output Override Mux logic |
| Input Logic 750/754 | Core pin's DL | All the input logic is tagged with the associated core pin's DL property. It is not necessary to fragment the input logic. |
| IO Control Overrides Logic 419 | Chip pin's DL2 or User defined DL or 'default' if undefined | The IO Control override logic can be placed in the default Chip pin's IO Control block in which case the Chip pin's DL2 property will be used. If the IO Control logic is shared by multiple chip pin's a user defined DL will be used. |

The three separate power domain properties on a device pin are used to place different portions its I/O logic into different domains. The values for these three domain properties can be the same.

The input path's multiplexer select and control logic 750 and the input override logic 754 is placed in the core pin's generated by the 'spinner' tool 601. This technique can be applied to any part of the multiplexing and I/O cell control circuitry 214 described in previous sections. In the I/O specification 609 users simply need to indicate that hand-crafted logic should be utilised for a given logic type on a given device pin 116.

The interface of the hand-crafted transistor level logic, henceforth referred to as a structural multiplexer cell 1001, shown in FIG. 13 is captured 608 as part of the I/O specification 609. The I/O specification will contain a library of structural multiplexer cells 1001 whose interface contains a certain number of MuxIn ports 1002 of a particular width; a single MuxOut port 1003 whose width matches the MuxIn ports and a single MuxSelection port 1004. The ratio of the structural multiplexer cell is defined by the ratio of MuxIn to MuxOut ports. The width of the MuxSelection port is dependent on this ratio. On generation the automatically generated RTL multiplexer logic will be replaced by a structural multiplexer cell from the library which has the required multiplexer ratio and correct MuxIn/MuxOut port width. The MuxIn ports are numerically ordered where the port with the lowest numeric value will have the highest timing priority through the hand-crafted transistor logic. This ensures that the structural multiplexer when connected will maintain the desired timing priority for the different signals being multiplexed.

The RTL multiplexer logic which is automatically generated by spinner contains both the assignment and condition statements that collectively describe the multiplexer logic. In order to replace it with a structural multiplexer cell the conditional statements must be extracted and used to create a separate RTL multiplexer structure 1005 (condition selection mux) which is used to select the path through the hand-craft transistor logic. Each condition statement is assigned a numeric vector based on its priority in the original RTL multiplexer logic. In the case of the OutputEnable 733 path any polarity issues are automatically handled as part of the original assignment statements of the automatically generated RTL multiplexer logic. Any signals whose polarity is incorrect must be first inverted before entering the structural multiplexer cell.

The tool allows very flexible device pin multiplexing and control logic to be automatically generated which take into account the unique timing, control priority and power design constraints on the device pins and any core signals which are multiplexed on it.

Thus far in the description the actual resulting output logic which is created has been described. The algorithms used to create the logic for the I/O fabric are described in representative pseudo-code below. This pseudo-code covers the preferred embodiment described in FIG. 9 for the functional and test output path. The pseudo code does not cover all the corner cases which have been realised in the 'spinner' tool 601, particularly scenarios where logic is omitted (for example, a dedicated core output pin connected directly to an I/O cell output port).

Output Override Logic

The override logic whose interfaces are described in FIG. 7 is best described using a logic truth table.

| Override Type | Output Value 764 | OE Value 766 | Override Selection 768 | | PUPD Control 770 | |
|---|---|---|---|---|---|---|
| | | | Out Enable | OE Enable | PUPD Value | PUPD Enable |
| Zero | 0 | OUT_ON | ENABLE_ON | ENABLE_ON | PUPD_OFF | ENABLE_ON |
| One | 1 | OUT_ON | ENABLE_ON | ENABLE_ON | PUPD_OFF | ENABLE_ON |
| Signal | SIGNAL | OUT_ON | ENABLE_ON | ENABLE_ON | PUPD_OFF | ENABLE_ON |
| Z | XX | OUT_OFF | ENABLE_OFF | ENABLE_ON | PUPD_OFF | ENABLE_ON |
| PU | XX | XX | ENABLE_OFF | ENABLE_OFF | PU_ON | ENABLE_ON |
| PD | XX | XX | ENABLE_OFF | ENABLE_OFF | PD_ON | ENABLE_ON |
| PUZ | XX | OUT_OFF | ENABLE_OFF | ENABLE_ON | PU_ON | ENABLE_ON |
| PDZ | XX | OUT_OFF | ENABLE_OFF | ENABLE_ON | PD_ON | ENABLE_ON |
| PO | XX | XX | ENABLE_OFF | ENABLE_OFF | PUPD_OFF | ENABLE_ON |
| TestEnableOff | XX | XX | ENABLE_OFF | ENABLE_OFF | PUPD_OFF | ENABLE_OFF |
| OutputEnableOn | XX | OUT_ON | ENABLE_OFF | ENABLE_ON | PUPD_OFF | ENABLE_OFF |
| OutputEnable_signal | XX | SIGNAL | ENABLE_OFF | ENABLE_ON | PUPD_OFF | ENABLE_OFF |
| PUPDZ_signal | XX | XX | ENABLE_OFF | ENABLE_OFF | SIGNAL | ENABLE_ON |
| PUPD_signal | XX | XX | ENABLE_OFF | ENABLE_OFF | SIGNAL | ENABLE_ON |

In the case of an override of type TestEnableOff an additional mux in inserted on the test enable path 720 in order to force the disabling of the test logic ('enable_off'). The values of the constants used in the table above are described here:

| Constant | Value |
|---|---|
| OUT_ON | 0 (Defaults to output enable negative i.e. OEN but will match polarity of I/O Cells OE port). |
| OUT_OFF | 1 (Defaults to output enable negative i.e. OEN but will match polarity of I/O Cells OE port). |
| ENABLE_ON | 1 |
| ENABLE_OFF | 0 |
| PUPD_OFF | 00 |
| PU_ON | 01 |
| PD_ON | 11 |
| SIGNAL | The value of the overrides drive signal 763 |
| XX (do not care) | Defaults to 0 |
| LOW | 0 |
| HIGH | 1 |

Test Multiplexer Logic

The pseudo-code below describes how the test output multiplexer logic 816 is created.

```
If a pin has test multiplexing then
    Create Test OUT Mux
    Default value of mux is LOW
    For each pin test-mode sorted in order of priority
        If pin test-mode has core pin output (not input only)
            add 'select core pin output when test control equals test
                mode'
            If has output overrides
                add 'and NOT (override output enable equals
                    ENABLE_ON)'
            End If
        End If
    Next
    If pin has output overrides then
        add 'select override output value when override output enable
            equals ENABLE_ON'
```

-continued

```
    End If
Else If pin has output overrides then
    connect override output value to functional output multiplexer
End If
```

The pseudo-code below describes how the test output enable multiplexer logic 818 is created.

```
If pin's I/O cell has an output enable
    If a pin has test multiplexing then
        Create Test OE Mux
        Default value of OE signal is OUT_OFF
        For each test-mode sorted in order of priority
            If the test-mode has a core pin muxed
                If the core pin has an OE Signal then
                    If core pin OE polarity not equal to I/O cell's OE port's polarity then
                        invert core pin OE signal's polarity
                    End If
                    add 'select Core OE signal when test control equals test-mode '
                    If has output overrides
                        add 'and NOT (override output enable equals ENABLE_ON)'
                    End If
                End If
                If the core pin has no OE Signal then
                    add 'select OUT_ON for test-mode when test control equals test-mode '
                    If has output overrides
                        add 'and NOT (override output enable equals ENABLE_ON)'
                    End If
                End If
                If the core test pin is an input (no OE Signal) then
                    add 'select OUT_OFF when test control equals test-mode'
                    If has output overrides
                        add 'and NOT (override output enable equals ENABLE_ON)'
                    End If
                End If
            End If
        Next
        If pin has output overrides
            add 'select override output enable value when override output enable equals ENABLE_ON'
        End If
    Else If pin has output overrides then
        connect override output enable value to functional output enable multiplexer
    End If
End If
```

The 'test enable value' forms a portion of test select logic 820. The test enable is 'ENABLE_ON' whenever a test-mode is selected which has a valid output. The test enable logic is best described using the logic truth table below.

| Test Control 720 | Test mode present | Test Enable |
|---|---|---|
| 0 | xx | ENABLE_OFF |
| Non zero | Has no test output multiplexed | ENABLE_OFF |
| Non zero | Has test output multiplexed | ENABLE_ON |

The pseudo-code below describes how the test select logic 820 is created.

```
// Test / Override Output Selection logic
If pin has test multiplexing or pin has output overrides then
    Create Test/Override OUT Enable mux
    Default value is ENABLE_OFF
    If pin has test multiplexing
        add 'select ENABLE_ON when test_enable equals
        ENABLE_ON'
```

-continued

```
    End If
    If pin has output overrides
        add 'select ENABLE_ON when override_out_enable
        equals ENABLE_ON'
    End If
End If
// Test / Override Output Enable Selection logic
If pin has test multiplexing or pin has output overrides then
    Create Test/Override OE Enable mux
    Default value is ENABLE_OFF
    If pin has test multiplexing
        add 'select ENABLE_ON when test_enable equals
        ENABLE_ON'
    End if
    If pin has output overrides
        add 'select ENABLE_ON when override_OE_enable
        equals ENABLE_ON'
    End If
End If
```

Functional Multiplexer Logic

The pseudo-code below describes how the functional output multiplexer logic 810 is created. It should be clear that the pseudo-code is very similar to that of the test output multiplexer logic 816 described above.

```
If a pin has functional modes then
    Create Functional OUT Mux
    Default value of mux is LOW
```

-continued

```
For each pin functional-mode sorted in order of priority
    If pin functional-mode has core pin output (not input only)
        add 'select core pin output when pin control equals
            functional mode'
        If has test/override
            add 'and NOT (test/override output enable equals
                ENABLE_ON)'
        End If
    End If
Next
If pin has test multiplexing or output overrides then
    add 'select test/override output value when test/override output
enable equals ENABLE_ON'
    End If
End If
```

The algorithm used to create functional output enable multiplexer logic 812 is very similar to that of the test output enable multiplexer logic 818 and therefore no pseudo-code example has been provided.

The algorithm used to create the functional selection logic 814 is very similar to the test selection logic 820 and therefore no pseudo-code example has been provided.

Input Multiplexer Logic

The pseudo-code below describes how the input override logic 754 is created.

```
// Input Override value
If a core pin has input overrides then
    Create Input Override Mux
    Default value is LOW
    For each core pin input override in order of priority
        If input override type is ONE, add 'select HIGH when override
enable equals ENABLE_ON'
        If input override type is ZERO, add 'select LOW when override
enable equals ENABLE_ON'
        If input override type is Signal, ADD 'select override drive
signal when override enable equals ENABLE_ON'
    Next
End If
// Input Override selection
If a core pin has input overrides then
    Create Input Override Enable Mux
    Default value is ENABLE_OFF
    For each core pin input override in order of priority
        add 'select ENABLE_ON when override enable equals
            ENABLE_ON'
    Next
End If
```

The pseudo-code below describes how a core pin's input multiplexing and protection logic 750 is created.

```
If core pin has input path
    If core pin is not dedicated (multiplexed only once) then
        Create Core Pin Input Mux
        For each functional mode
            For each chip pin
                If core pin multiplexed in functional mode then
                    - add 'select chip pin when chip pin control equals functional mode
                    For each test-mode
                        If chip pin has multiplexing in test-modes on current chip pin then
                            If first then
                                - add ' and NOT (chip pin test control equals test-mode
                            Else
                                - add ' OR chip pin test control equals test-mode
                            End If
                            If last - add')'
                        End If
                    Next
                End If
            Next
        Next
        For each test mode
            For each chip pin
                If core pin multiplexed in test mode then
                    - add 'select chip pin when chip pin test control equals test mode'
                End If
            Next
        Next
        If core pin input protection is ZERO, add LOW
        If core pin input protection is ONE, add HIGH
        If core pin protection is Signal, add Protection Signal
        // input protection of type pin protection not allowed as core pin is not dedicated
    Else if core dedicated but not pin protected
        Create Core Pin Input Mux
            add 'select chip pin when chip pin control equals functional mode
            For each test-mode
                If chip pin has multiplexing in test-modes on current chip pin then
                    If first then
                        - add 'NOT (chip pin test control equals test-mode
                    Else
                        - add ' OR chip pin test control equals test-mode
                    End If
                    If last - add')'
                End If
            Next
            If core pin input protection is ZERO, add LOW
            If core pin input protection is ONE, add HIGH
```

```
        If core pin protection is Signal, add Protection Signal
    End If
End if
```

The pseudo-code below describes how the input override logic 754 is combined with the core pin's input multiplexing and protection logic.

```
If a core pin has input overrides then
      Create input Ctrl mux
      add 'select input override value when input override selection equals
      ENABLE ON
      If core pin is dedicated and pin protected then
                add input path for chip pin (BSR/IO cell)
      Else
                add output from Core Pin Input Mux
          End If
            Connect output of input Ctrl mux to core pin
Else
      If core pin is dedicated and pin protected then
            connect input path for chip pin (BSR/IO cell) directly to
            core pin
      Else
            connect output from Core Pin Input Mux to core pin
      End If
End If
```

Domain Partitioning

Domain partitioning is an optional set of algorithms which can be applied to the I/O fabric 625, the spinner tool 601 supports the generation 612 of logic with or without these techniques being applied.

The algorithm used to fragment the functional and test output and output enable multiplexer logic 810, 812 has already been described in FIGS. 11 and 12.

A table outlining the domain property which is applied to each logic type in the I/O fabric 625 has already been detailed. When partitioning the I/O fabric it is necessary in certain circumstances to introduce feed-through component instances in order to allow them to be tagged with a domain property. This then allows power isolation and level shifter logic to be easily inserted. A feed-through component is one where the inputs to the component are simply feed-through the component and appear as outputs with no additional logic being inserted. These types of components are normally undesirable as they lead to the creation of unnecessary logic buffers.

The pseudo-code below describes when a feed-through component should be created on the functional output 710 or output enable 712 paths.

```
If a chip pin has a functional core pin with a unique Domain level for that
chip pin then
      If the chip pin path has an Fmux Mux Ctrl defined then
            If ChipPin.DL1 is NOT EQUAL to CorePin.DL then
                  create a domain level feed thru component
            End If
      Else If chip pin path has No Fmux Mux Ctrl and chip pin has BSR
      cell
            If ChipPin.DL2 is NOT EQUAL to CorePin.DL then
                  create a domain level feed thru component
            End If
      Else If chip pin path has no Fmux Mux Ctrl and No BSR Cell then
            If ChipPin.DL1 is NOT EQUAL to CorePin.DL then
                  create a domain level feed thru component
            End If
```

```
      Else
            Don't create Feed thru component
      End If
End If
```

The pseudo-code below describes when a feed-through component should be created on the test output 716 or output enable 718 paths.

```
If a chip pin has a test core pin with a unique Domain level for that chip
pin then
      If CorePin.DL is NOT EQUAL to ChipPin.DL3 then
            create a domain level feed thru component
      Else
            don't create Feed thru component
      End If
End If
```

The pseudo-code below describes when a feed-through component should be created on a core pin input path 752.

```
If no input mux component is created for a Core Pin
      If the Muxed ChipPin for that CorePin has BSR component then
            If CorePin.DL is NOT EQUAL to ChipPin.DL2 then
                  create a domain level feed thru component
            End If
      If the Muxed Chip Pin for that Core Pin has NO BSR component then
            If CorePin.DL is NOT EQUAL to ChipPin.DL1 (I/O cell
            domain)
                  create a domain level feed thru component
            End If
      Else (same domain)
            Don't create Feed thru mux
      End If
End If
```

Structural Mux Logic

The pseudo-code below describes how any of the automatically generated multiplexer logic generated by spinner can be replaced by a structural mux cell instantiation.

```
For each mux
      If mux marked as needing a structural mux then
            Instantiate a structural mux cell matching the required mux ratio
            For mux assignment statements in order of priority
                  If assignment is an equation then
                        Create equation logic
                        Connect output of equation logic to MuxIn port of
                        corresponding priority
                  Else
                        Connect assignment signal to MuxIn port of
                        corresponding priority
                  End If
            Next
            Create condition selection mux
            For mux condition statements in order of priority
                  Create numeric value representing priority
                  Select numeric value when condition
```

```
    Next
        Connect condition selection mux output to structural mux cell's
            Selection port
        Connect structural mux cell's Output port to output of mux
        Remove mux logic
    End If
Next
```

I/O Logic Generation

Thus far in the description the actual resulting logic which is created has been described as well the individual algorithms used to generate particular portion of the I/O Fabric 625 logic. In order to generate the full logic, the complex dependency graph between the individual algorithms must be described and the actual run order of each of the algorithms defined. The 'spinner' tool 601 describes these dependencies using an XML wiring framework and has a wiring engine which uses this XML description too control the order in which individual algorithms are executed. The table below details the main elements of the wiring framework:

logic thus achieving an alternative priority of control and timing layout for the pin multiplexer and control structures 730 on the output path).

The wiring model consists broadly of two types of elements; structural elements and contribution specification elements.

| Structural Elements | Contribution Specifications |
| --- | --- |
| Block | Contribution |
| Hook | Bind |
|  | Connection |

The structural portion of the wiring defines a set of elements which can be bound to contributor slots and therefore forms a structural fabric which is used to communicate information (messages) between the various contributors during the synthesis. They are basically a tree of named elements. Block and hook wiring model elements can be bound too by a contribution declaration using a bind. Where two contributions bind to the same structural element (Block or Hook)

| Term | Description |
| --- | --- |
| Wiring Engine | Runtime framework. Manages dependencies between contributors. Determines based on scope and the set of fulfilled dependencies whether a contributor should be executed. |
| Wiring Model | The wiring forms the skeleton or structure of the synthesis process which will be run but does not define the logic which will be generated. It essentially defines the dependency hierarchy of the contributors. It is described using an XML syntax. |
| Wiring Context | The wiring context contains the run time information passed to the contributors. |
| Source Model | The input model/design data. In the case of spinner this is the I/O specification 609. |
| Target Model | The output model/design data, where the results of the synthesis will be stored. In the case of spinner this is the I/O Fabric 625 logic represented as software objects. |
| Slot/mailbox | A slot is a message box which can hold an object of data. It is used by the wiring framework to pass information between contributors using the requires/provides wiring model declarations. |
| Contributor | Implementation of a transformation (algorithm) which needs to be performed during the synthesis. |
| Contribution/ Contribution Declaration | A contribution is used to bind a Contributor to some of the wiring model structural (block, hook) elements. The set of contributions within the wiring model defines the dependency between contributors and thus their synthesis run order. A contribution declaration can contain zero or more required bindings and zero or more provided bindings. |
| Block | A block is a named container (wiring structural) element, which can contain other types of elements. It can be bound too contribution declarations via its name. |
| Hook | A hook is a named leaf (wiring structural) element whose sole purpose is to be bound to contributions via slots. |
| Bind/Binding | A bind is owned by a contribution and defines a mapping between a named slot (used by the contributor at runtime to access data) and a wiring model structural element (block, hook) used to link contributions into a dependency hierarchy. |
| Connection | A short-hand notation to define a contribution declaration for the 'ConnectionInstanceContributor' contributor. |
| Scope | The scope is used to define the dimensions of the wiring model. A scope attaches a scope handler implementation to the wiring model. |
| ScopeHandler | Implementation which at wiring runtime is used to determine how often the contributors which fall within this scope will be run via the wiring context. |

The wiring framework is a generic technology which can be used to generate any type of hardware logic which can be described via a set of interdependent algorithms. The wiring model XML is human readable and therefore can be modified to insert new contribution steps (algorithms) or change the generated logic (E.g. the cascaded order of the multiplexer then these contributors can pass information to each other. Therefore as stated above they form a structural fabric to allow contributors to pass information via slots (mailboxes) to each other.

The contribution specification portion of the wiring model essentially defines the set of contributors which will be involved in the generation of the logic and allows the dependencies between the different contributors to be defined so that their run order can be determined. A contribution declaration can contain zero or more required binds and zero or more provided binds. A bind creates a two way binding:

Slot binding—used at synthesis runtime to allow the contributors to retrieve data from required binds and post data to provided binds via named slots.

Element binding—Specifies the dependency between contributions. One contribution provides while zero or more contributions can require the binding. When binds refer to the same structural element then they are linked thus creating the dependency hierarchy.

The required binds define which slots (message boxes) must be filled before the contributor associated with the contribution declaration can be run. The provided binds effectively specifies a contract that the contributor aims to fulfil by putting data into these slots when it is run.

The scope element is used to define the dimensions of the wiring model. The scope declaration should be considered a marker which associates a scope/dimension to the elements that it (the scope declaration) contains. A scope declaration references a scope handler. The scope handler is an implementation which determines how often the contributors will be run via the wiring context. In the spinner wiring model some sample scopes include:

Set of Chip Pins;
Set of BSR Chains;
Set of Core pins.

The table below shows a small portion of the wiring framework used by the 'spinner' tool 601 which is used to create the input override 754 and input multiplexing and control matrix 750 logic.

```
<block name='input-muxing'>
    <hook name='pin_conf_mode'/>
    < hook name='input-overrides'/>
    < hook name='core-pin'/>
    < hook name='protection'/>
    < hook name='core-pin-pads'/>
    < hook name='input-struct-mux'/>
</block>
<scope name='core-pin-scope'>
    <contribution name='input-mux-comp-contrib' contributor='ComponentContributor'>
        <bind slot='CONTAINER' required='true' element='top'/>
        <bind slot='INSTANCE' provided='true' element='input-muxing'/>
    </contribution>
    <contribution name='input-mux-contrib' contributor='InputMuxContributor'>
        <bind slot='CONTAINER' required='true' element='input-muxing'/>
        <bind slot='CORE_PIN' required='true' element='input-muxing/core-pin'/>
        <bind slot='CHIP_PINS' required='true' element='input-muxing/core-pin-pads'/>
        <bind slot='CONF_MODES' opt_required='true' element='input-muxing/pin_conf_mode'/>
        <bind slot='INPUT_OVERRIDE' opt_required='true' element='input-muxing/input-overrides'/>
        <bind slot='PROTECTION_CP' provided='true' element='input-muxing/protection'/>
        <bind slot='STRUCT_MUX' provided='true' element='input-muxing/input-struct-mux'/>
    </contribution>
    <contribution name='struct-mux-contrib' contributor='StructuralMuxContributor'>
        <bind slot='CONTAINER' required='true' element='input-muxing'/>
        <bind slot='STRUCT_MUX' required='true' element='input-muxing/input-struct-mux'/>
    </contribution>
    <contribution name='input-mux-conf-mode-locator' contributor='CorePinConfModeLocator'>
        <bind slot='CONTAINER' required='true' element='core'/>
        <bind slot='CONF_MODES' provided='true' element='input-muxing/pin_conf_mode'/>
    </contribution>
    <contribution name='input-mux-core-pin-port-locator' contributor='InputCorePortLocator'>
        <bind slot='CONTAINER' required='true' element='core'/>
        <bind slot='PORT' provided='true' element='input-muxing/core-pin'/>
    </contribution>
    <contribution name='input-override-locator' contributor='OverrideLocatorContributor' >
        <bind slot='CONTAINER' required='true' element='top'/>
        <bind slot='CORE' required='true' element='core'/>
        <bind slot='unused-slot-but-needed-no-ensure-custom-dependency' opt_required='true' element='custom-instances'/>
        <bind slot='PIN_OVERRIDES' provided='true' element='input-muxing/input-overrides'/>
    </contribution>
    <contribution name='protection-locator' contributor='input.ProtectionLocatorContributor'>
        <bind slot='CONTAINER' required='true' element='top'/>
        <bind slot='CORE' required='true' element='core'/>
        <bind slot='unused-slot-but-needed-no-ensure-custom-dependency' opt_required='true' element='custom-instances'/>
        <bind slot='PROTECTION_CP' required='true' element= 'input-muxing/protection'/>
    </contribution>
    <contribution name='chip-pin-locator' contributor='IoCellInputsLocator'>
        <bind slot='CONTAINER' required='"true' element='top'/>
        <bind slot='PIN_INPUTS' provided='true' element='input-muxing/core-pin-pads'/>
    </contribution>
</ScopeRef>
```

Figure 15:
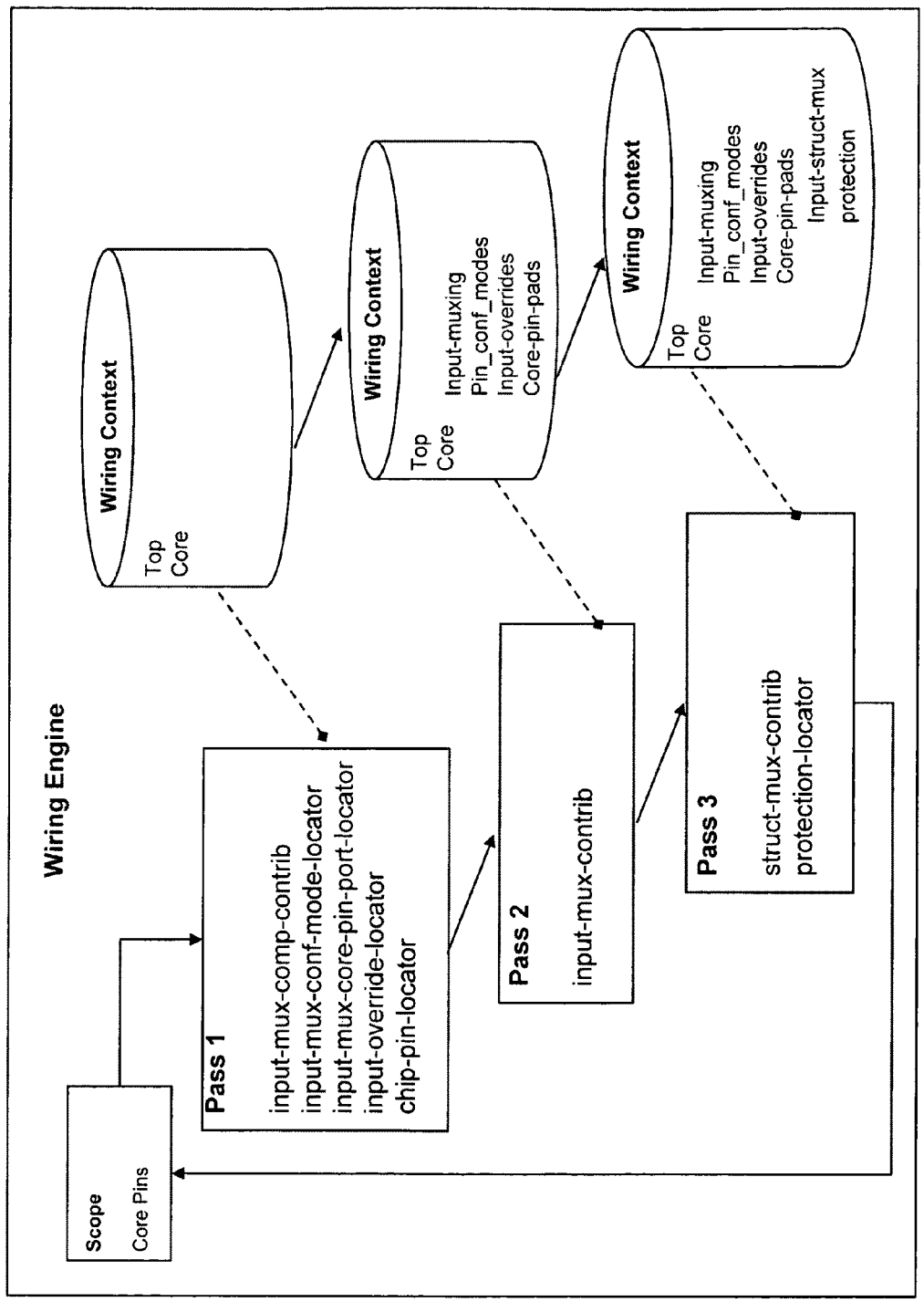
FIG. 15 shows how a wiring engine resolves dependencies between different contributors which need to be executed in order to construct logic.

FIG. 15 should be read in conjunction with the previous portion of the overall spinner wiring xml, which explains how the dependencies between the contributors which create the input override 754 and input multiplexing and control 750 logic are resolved. It shows how the wiring engine will resolve the dependencies between the different contributors which need to be executed in order to construct the input override 754 and input multiplexing and control 750 logic. FIG. 15 shows that for each core pin in the 'core-pin-scope' there will be a maximum of three synthesis passes. The core and the chip top components must already be available in the wiring context before the 'core-pin-scope' will be executed. On the first pass for a given core pin the wiring engine will determine that the contributors below have their required dependencies (required slots) fulfilled and therefore will execute them in the order they appear in the wiring XML:

| Contribution name | Description |
| --- | --- |
| input-mux-comp-contrib | Determines if the core-pin requires a input multiplexing component. A component is not required if the core-pin is dedicated, is pin protected and does not have any input overrides instead a direct connection will be created. |
| input-mux-conf-mode-locator | Locates each of the pin control 714 and test pin control 720 ports on the core interface that control the functional and test modes that this core pin is multiplexed in. |
| input-mux-core-pin-port-locator | Locates the port on the core interface which corresponds to this core pin's input path 752. |
| input-override-locator | Locates the override enable 756 and override drive 757 ports which are used by the input overrides defined on the core pin. |
| chip-pin-locator | Locates either the input port 416 on the I/O Cell or else that BSR cell's data out port 512 for each of the chip pins that this core pin is multiplexed on. |

On the second pass the wiring engine will see if any further contributors have had their dependencies fulfilled. The only potential candidate is the 'input-mux-contrib'. This is the contributor which implements the algorithm previously described to create input multiplexer 750 and override 754 logic. The 'input-mux-contrib' contributor will potentially provide two slots PROTECTION_CP and STRUCT_MUX. Depending on whether the slots have been provided the wiring engine will determine if the following two contributors should be executed in the third pass.

| Contribution name | Description |
| --- | --- |
| struct-mux-contrib | If the STRUCT_MUX slot was provided in the previous pass then the structural mux logic algorithm described earlier will be executed. |
| protection-locator | If the core pin is protected as true then this contributor will locate this signal 753 and connect it to the input port on the input mux component. |

The wiring engine moves onto the next core pin in the scope when a pass occurs where no new contributors have had their dependencies fulfilled. The same steps will be repeated for each core pin in the scope.

Description of Alternative Realisation

The invention is not limited to the embodiments described but may be varied in construction and detail.

Figure 14:
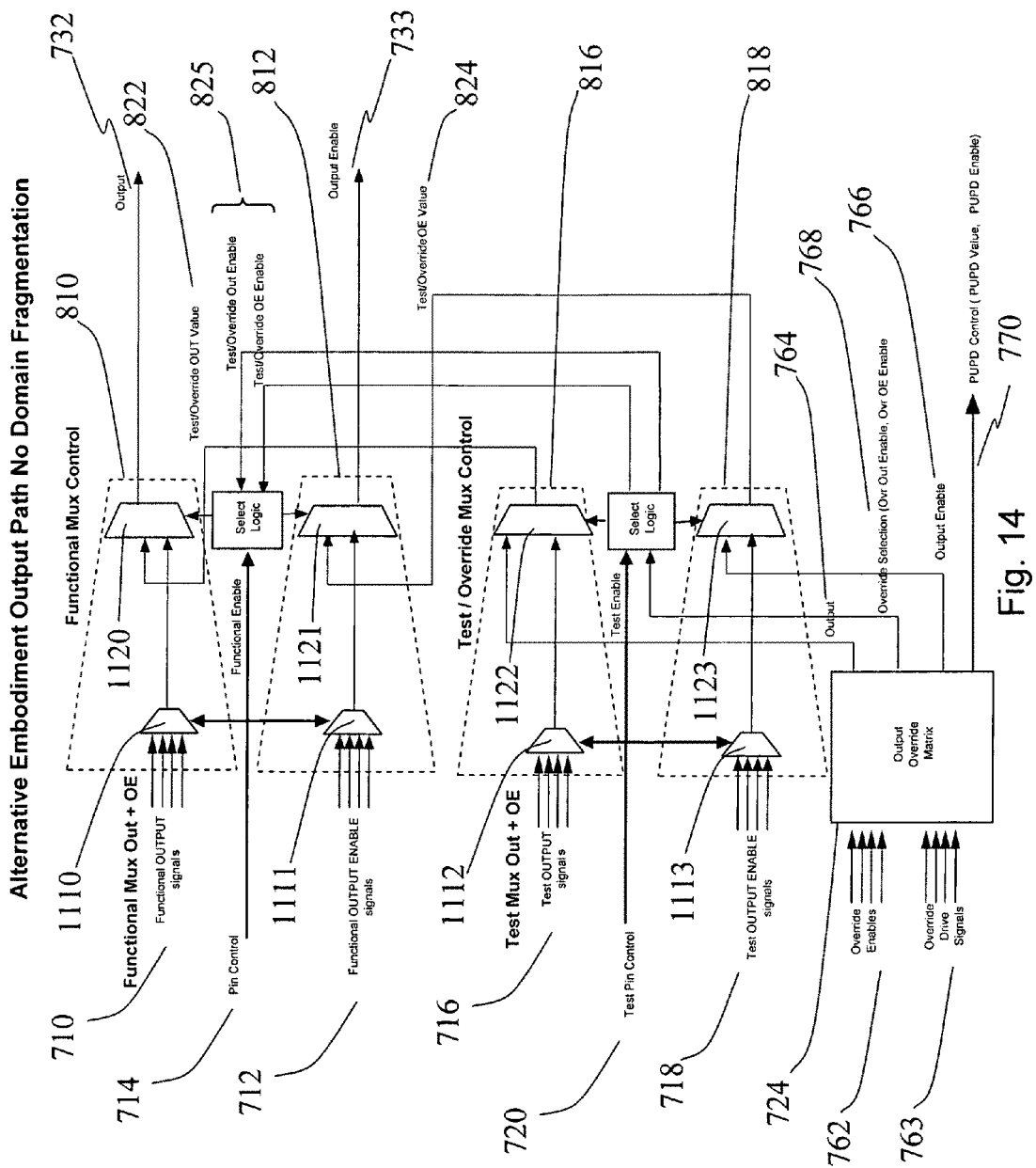
FIG. 14 shows an alternative embodiment of multiplexer arrangements for delivering output and output enable logic to an I/O cell.

FIG. 14 shows an alternative embodiment of how the output and output enable logic can be generated. Comparing it against FIG. 9 the main difference is that the multiplexers 810, 812, 816, 818 shown as have been implemented in two stages. The multiplexers 810, 812, 816, 818 are shown as dotted lines on FIG. 14. In the first stage on FIG. 14 the functional output 1110, functional output enable 1111, test output 1112 and test output enable 1113 signals are multiplexer without regard to any other logic in the overall cascade of logic. This simplifies these multiplexer because they can be written as 'select core pin output when pin control equals functional mode' without the need to add the additional checks to ensure that test or override logic is not enabled 'and NOT (test/override output enable equals ENABLE_ON)'. The output for these first stage multiplexers is then feed into a Mux Control stage 1120, 1121, 1122, 1123 where selection over which particular logic type has priority of control is decided. The second difference between the logic arrangements in FIG. 9 and FIG. 14 is that in the case of FIG. 15 the test and override logic have essentially identical timing priority. Functional logic has the fastest timing priority in both embodiments. Domain fragmentation can be applied to the multiplexer logic 1110, 1111, 1112, 1113 shown in FIG. 14 using the same technique described in FIGS. 11 and 12.

What is claimed is:

1. A method of generating a design for an I/O fabric of a target integrated circuit having a core, said core having internal core pins and the fabric having external I/O chip pins, the method being performed by a programmed computer operating as a process tool executing algorithms to generate a synthesizable representation of the I/O fabric ring in hardware description language and comprising the steps of:

importing integrated circuit design data from a computer, from said design data, capturing I/O specification data for the core, cells, pins, I/O control, BSR and I/O cell chaining, and die for the target integrated circuit, validating said specification data, and from said validated specification data, generating the I/O fabric design by synthesizing, configuring and interconnecting multiplexers in a cascaded arrangement according to constraints for signal control and timing, wherein a control matrix structure is realized for each pin on both the input and output paths for the following logic types:

a functional multiplexer matrix structure,
a test multiplexer matrix structure,
an override matrix structure,
a multiplex select and control matrix structure, and
I/O cell control logic;

wherein the output path for a chip pin is sourced during the method from any number (1 ... n) of functional or test core pins, there being different pin functional or test modes for at least some different sources and comprising the step of dynamically selecting a functional or test core pin for an output chip pin, wherein the selection for a given logic type controls an individual chip pin, a group of related chip pins or globally all chip pins;

wherein control priority of functional, test, and override logic in the I/O fabric is configurable;
wherein timing priority of functional, test, and override logic in the I/O fabric is configurable; and
wherein:
required core pin input circuitry is configurable,
a core input may be a functional or test input,
a core input is sourced from multiple chip pins, each having an associated prioritization, and each having an associated selection control signal,
a core input is dynamically controlled from any number of prioritized pin (0 . . . n) input overrides, and
if no chip pin or input override is selected a default protection value is supplied.

2. The method as claimed in claim 1, wherein a required pin input and output path logic is configured by modification of the I/O specification data, and/or modification of a manner of wiring of the algorithms, and/or by modification of the algorithms.

3. The method as claimed in claim 1, wherein a required pin input and output path logic is configured by modification of the I/O specification data, and/or modification of a manner of wiring of the algorithms, and/or by modification of the algorithms; and wherein the tool wires algorithms according to a wiring framework, and said wiring framework is modified.

4. The method as claimed in claim 1, wherein the output path of a chip pin is dynamically controlled during the process from any number of pin (0 . . . n) output overrides, in which an override is enabled by a Boolean logical equation of signals existing within the chip.

5. The method as claimed in claim 1, wherein the method applies control by setting values in the override matrix structures comprising any or all of:
forcing a value on an output pin, including controlling pull-up/pull down logic,
allowing an override to output a pin logical value or the value of any signal within the chip,
allowing an override to have the ability to control the output enable of an I/O cell,
forcing logic into a test mode,
forcing logic into a functional mode,
an override having an inherent priority in which one override can override another, and/or allowing a priority to be specified by a user.

6. The method as claimed in claim 1, wherein the method comprises performing timing optimisation for functional or test output path multiplexer logic, in which for each chip pin a priority ordering of input signals to the multiplexer is created to determine timing priority through said multiplexer.

7. The method as claimed in claim 1, wherein a default configuration of control priority is that functional multiplexing has precedence over test multiplexing, which has precedence over overrides.

8. The method as claimed in claim 1, wherein a default configuration for timing priority is that functional multiplexing has precedence over test multiplexing, which has precedence over overrides.

9. The method as claimed in claim 1, comprising: generating a behavioral description of a multiplexer, and combining said multiplexer behavioral descriptions in a cascade of logic to provide the I/O fabric design.

10. The method as claimed in claim 1, comprising: generating a behavioral description of a multiplexer, and combining said multiplexer behavioral descriptions in a cascade of logic to provide the I/O fabric design; and comprising the steps of automatically replacing the generated behavioral description with a structural multiplexer cell instance from a library, extracting conditional statements from the behavioral multiplexer description and assigning them a numeric vector based on their priority, and using said numeric vectors to select the input logic signal which will be driven on the output of the structural multiplexer cell.

11. The method as claimed in claim 1, wherein:
an input override can be enabled by any logical equation of signals existing within the integrated circuit including:
forcing a logical or signal value on a core input pin, and
a core input pin is protected if no chip pin or input override is selected, wherein the protection value is either a logical value, a signal value, or a chip pin when the core pin is only assigned to a single chip pin.

12. The method as claimed in claim 1, wherein the prioritization of the chip pins multiplexed on a core pin input path is determined based on logic type, with the lowest mode number within the logic type taking precedence, and if the input core pin is in the same mode for the logic type on different chip pins then the highest ordered chip pin will take precedence.

13. The method as claimed in claim 1, wherein the logic of the I/O fabric is tagged according to power domains, and thus the inputs and outputs of the multiplexers have an associated power domain, and multiplexers are fragmented on the basis of the power domains.

14. The method as claimed in claim 1, wherein:
the logic of the I/O fabric is tagged according to power domains, and thus the inputs and outputs of the multiplexers have an associated power domain,
the output path core pin multiplexers whose input signals have different domain references are fragmented into two stages,
a new multiplexer is created in a first stage per unique domain reference which has more than one input signal belonging to it,
the outputs of the first stage are multiplexed into a second stage along with
the output from any preceding logic in the cascade of logic, and
the combination of multiplexer logic fragments is logically equivalent to the original un-fragmented multiplexer.

15. The method as claimed in claim 1, wherein I/O control override equations are used to control and configure the I/O cell used by a chip pin, equation definitions are re-used by substitution of dynamic information, and the resulting logic, when equivalent, is shared by multiple I/O cell control ports.

16. The method as claimed in claim 1, comprising: generating a behavioral description of a multiplexer, and combining said multiplexer behavioral descriptions in a cascade of logic to provide the I/O fabric design; and wherein the tool generates the behavioural description for test or functional output signal multiplexer logic by performing the steps of:
creating the output multiplexer and setting the default value of the multiplexer to LOW,
for each of a plurality of pin modes, either functional or test, sorting in order of priority: and if the pin's mode has core pin output then selecting the core pin output signal when the control signal for the logic type equals the current mode, and if the pin has preceding logic in the cascade of multiplexers then ensuring that an output enable signal for preceding logic is not enabled, and
if a pin has preceding logic in the cascade of multiplexers then selecting its output value when the output enable signal for this logic is enabled.

17. The method as claimed in claim 1, comprising: generating a behavioral description of a multiplexer, and combining said multiplexer behavioral descriptions in a cascade of logic to provide the I/O fabric design; and wherein the tool generates the behavioural description for test or functional output enable signal multiplexer logic by performing the steps of:

creating the output enable multiplexer and setting the default value of the multiplexer to OUT_OFF, for each of a plurality of pin modes, either functional or test, sorting in order of priority:

if the pin's mode has core pin output but the core pin's output enable (OE) signal's polarity is not equal to the I/O cell's OE polarity then invert the core pin OE signal's polarity, if the pin's mode has core pin output and the core pin has an OE signal then selecting the core pin's OE signal when the control signal for the logic type equals the current mode, and if the pin has preceding logic in the cascade of multiplexers then ensure that the OE enable signal for preceding logic is not enabled, if the pin's mode has core pin output and the core pin does not have an OE signal then selecting OUT_ON when the control signal for the logic type equals the current mode, and if the pin has preceding logic in the cascade of multiplexers then ensure that the OE enable signal for the preceding logic is not enabled, and if the pin's mode has core pin input then selecting OUT_OFF when the control signal for the logic type equals the current mode, and if the pin has preceding logic in the cascade of multiplexers then ensure that the OE enable signal for the preceding logic is not enabled, and if a pin has preceding logic in the cascade of multiplexers then select its OE value when the OE enable signal for this logic is enabled.

18. The method as claimed in claim 1, comprising: generating a behavioral description of a multiplexer, and combining said multiplexer behavioral descriptions in a cascade of logic to provide the I/O fabric design; and wherein the tool generates the behavioural description for an enable signal selection multiplexer by performing the steps of:

creating the enable signal selection multiplexer and setting the default value of the multiplexer to disabled, for each of a plurality of pin modes, either functional or test, sorting in order of priority:

if the pin's mode has core pin output then selecting enabled when the control signal for the logic type equals the current mode, if the pin has preceding logic in the cascade of multiplexers then selecting enabled when the logic enable signal for the preceding logic is enabled.

19. The method as claimed in claim 1, comprising: generating a behavioral description of a multiplexer, and combining said multiplexer behavioral descriptions in a cascade of logic to provide the I/O fabric design; and wherein the tool generates the behavioural description for input override multiplexer logic by performing the steps of:

creating an input override multiplexer and setting the default value of the multiplexer to LOW, for each of a plurality of core pin input overrides, sorting in order of priority:

if the input override type is ONE then selecting a HIGH override value when the override enable control signal is enabled, if input override type is ZERO then selecting a LOW override value when the override enable control signal is enabled, and if input override type is signal, selecting override drive signal override value when override enable control signal is enabled.

20. The method as claimed in claim 1, comprising: generating a behavioral description of a multiplexer, and combining said multiplexer behavioral descriptions in a cascade of logic to provide the I/O fabric design; and wherein the tool generates the behavioural description for input multiplexer logic by performing the steps of:

creating an input multiplexer and setting the default value of the multiplexer to be the core pin's input protection value, for each of a plurality of functional modes and then for each of a plurality of chip pins:

if a core pin is multiplexed in the functional mode then selecting the chip pin when the current chip pin's functional control signal equals the current functional mode, and for each of a plurality of test modes if the current chip pin has multiplexing in the current testmodes on the current chip pin, then ensure that the chip pin's test control is not equal to the current test mode, and for each of a plurality of test modes and then for each of a plurality of chip pins:

if a core pin is multiplexed in the current test mode then selecting the current chip pin when the current chip pin's test control signal equals the current test mode.

21. A non-transitory, computer readable medium having a computer readable program code embodied thereon, said code being adapted to, when executing on a digital processor, implement the steps of:

importing integrated circuit design data, from said design data, capturing I/O specification data for the core, cells, pins, I/O control, BSR and I/O cell chaining, and die for the target integrated circuit, validating said specification data, and from said validated specification data, generating the I/O fabric design by synthesizing, configuring and interconnecting multiplexers in a cascaded arrangement according to constraints for signal control and timing, wherein a control matrix structure is realized for each pin on both the input and output paths for the following logic types:

a functional multiplexer matrix structure a test multiplexer matrix structure, an override matrix structure, a multiplex select and control matrix structure, and I/O cell control logic wherein the output path for a chip pin is sourced during the method from any number (1 . . . n) of functional or test core pins, there being different pin functional or test modes for at least some different sources and comprising the step of dynamically selecting a functional or test core pin for an output chip pin, wherein the selection for a given logic type controls an individual chip pin, a group of related chip pins or globally all chip pins;

wherein control priority of functional, test, and override logic in the I/O fabric is configurable;

wherein timing priority of functional, test, and override logic in the I/O fabric is configurable; and wherein:

required core pin input circuitry is configurable, a core input may be a functional or test input, a core input is sourced from multiple chip pins, each having an associated prioritization, and each having an associated selection control signal, a core input is dynamically controlled from any number of prioritized pin (0 . . . n) input overrides, and if no chip pin or input override is selected a default protection value is supplied.

22. A data processing system comprising a digital processor, memory, a storage device, and input and output interfaces and the processor being adapted to operate as a tool to perform the steps of:

importing integrated circuit design data, from said design data, capturing I/O specification data for the core, cells, pins, I/O control, BSR and I/O cell chaining, and die for the target integrated circuit, validating said specification data, and from said validated specification data, generating the I/O fabric design by synthesizing, configuring and interconnecting multiplexers in a cascaded arrangement according to constraints for signal control and timing, wherein a control matrix structure is realized for each pin on both the input and output paths for the following logic types:

a functional multiplexer matrix structure a test multiplexer matrix structure, an override matrix structure, a multiplex select and control matrix structure, and I/O cell control logic wherein the output path for a chip pin is sourced during the method from any number (1 . . . n) of functional or test core pins, there being different pin functional or test modes for at least some different sources and comprising the step of dynamically selecting a functional or test core pin for an output chip pin, wherein the selection for a given logic type controls an individual chip pin, a group of related chip pins or globally all chip pins;

wherein control priority of functional, test, and override logic in the I/O fabric is configurable;

wherein timing priority of functional, test, and override logic in the I/O fabric is configurable; and wherein:

required core pin input circuitry is configurable, a core input may be a functional or test input, a core input is sourced from multiple chip pins, each having an associated prioritization, and each having an associated selection control signal, a core input is dynamically controlled from any number of prioritized pin (0 . . . n) input overrides, and if no chip pin or input override is selected a default protection value is supplied.

23. An integrated circuit having a core and pins and an I/O fabric with multiplexers, wherein there is different logic on pin output paths and pin input paths, there is a cascaded multiplexer arrangement to achieve control priority and timing priority for functional, test and override logic types: wherein the multiplexer arrangement provides:

maximum control priority for override logic signals, second highest control priority for test logic signals, lowest control priority for functional logic signals, maximum timing priority, having the shortest path, for the functional logic signals, second highest timing priority for the test logic signals, and lowest timing priority for the override logic signals wherein the output path for a chip pin is sourced during the method from any number (1 . . . n) of functional or test core pins, there being different pin functional or test modes for at least some different sources and comprising the step of dynamically selecting a functional or test core pin for an output chip pin, wherein the selection for a given logic type controls an individual chip pin, a group of related chip pins or globally all chip pins;

wherein control priority of functional, test, and override logic in the I/O fabric is configurable;

wherein timing priority of functional, test, and override logic in the I/O fabric is configurable; and wherein:

required core pin input circuitry is configurable, a core input may be a functional or test input, a core input is sourced from multiple chip pins, each having an associated prioritization, and each having an associated selection control signal, a core input is dynamically controlled from any number of prioritized pin (0 . . . n) input overrides, and if no chip pin or input override is selected a default protection value is supplied.

24. The integrated circuit as claimed in claim 23, wherein the multiplexer arrangement for each logic type in the overall cascaded multiplexer arrangement is implemented in first and second multiplexer stages, wherein:

the first multiplexer stage comprises solely of the logic signals for the logic type, the second multiplexer stage combines the output of the first stage with the output of the preceding logic type, where the preceding logic type is so defined based on timing priority, and the order of prioritization of signals into the second stage multiplexer is based on priority of control.

* * * * *